United States Patent
Kanetani et al.

(10) Patent No.: US 6,369,617 B1
(45) Date of Patent: Apr. 9, 2002

(54) SEMICONDUCTOR INTEGRATED CIRCUIT AND SEMICONDUCTOR LOGIC CIRCUIT USED IN THE INTEGRATED CIRCUIT

(75) Inventors: Kazuo Kanetani, Akishima; Hiroaki Nambu, Sagamihara; Kaname Yamasaki, Kokubunji; Takeshi Kusunoki, Tachikawa; Keiichi Higeta, Ome; Kunihiko Yamaguchi, Sayama; Fumihiko Arakawa, Tokorozawa, all of (JP)

(73) Assignees: Hitachi, Ltd., Tokyo; Hitachi ULSI Systems Co., Ltd.; Hitachi Device Engineering Co., Ltd., both of Kodaira, all of (JP)

( * ) Notice: Subject to any disclaimer, the term of this patent is extended or adjusted under 35 U.S.C. 154(b) by 0 days.

(21) Appl. No.: 09/437,268

(22) Filed: Nov. 10, 1999

(30) Foreign Application Priority Data

Nov. 11, 1998 (JP) .............................. 10-320205

(51) Int. Cl.[7] .................................. G11C 8/00
(52) U.S. Cl. .................... 326/105; 326/104; 326/108
(58) Field of Search ................. 326/104, 105, 326/106, 108

(56) References Cited

U.S. PATENT DOCUMENTS 4,394,657 A * 7/1983 Isogai et al. ............ 340/825.93
5,291,076 A    3/1994 Bridges et al.
5,373,203 A   12/1994 Nicholes et al.
5,448,527 A *  9/1995 Nambu et al. .......... 365/230.06

FOREIGN PATENT DOCUMENTS

JP           10150358          6/1998

* cited by examiner

Primary Examiner—Michael Tokar
Assistant Examiner—Anh Tran
(74) Attorney, Agent, or Firm—Antonelli, Terry, Stout & Kraus, LLP

(57) ABSTRACT

To speed up the operation of a decoder circuit, reduce the power consumption of the decoder circuit and increase the cycle, each circuit such as a buffer, a predecoder and a main decoder in the decoder circuit include a semiconductor logic circuit wherein the number of columns of transistors for pulling down an output node is small even if the number of inputs is large, and the true output signal and a complementary output signal having approximately the same delay time are acquired and the output pulse length of each circuit in the decoder circuit is reduced. By virtue of this arrangement, the operation of the decoder circuit can be sped up, the power consumption can be reduced, the cycles can be increased and, in a semiconductor memory, for example, the reduction of access time and power consumption and the increase of the cycles are enabled.

4 Claims, 20 Drawing Sheets

FIG. 13(a)
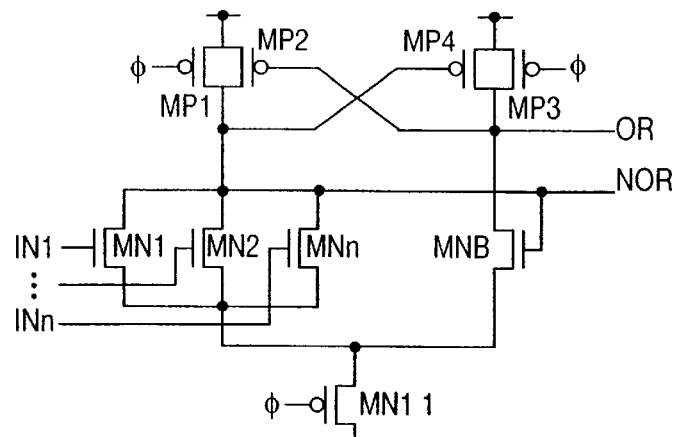
FIG. 13(b)
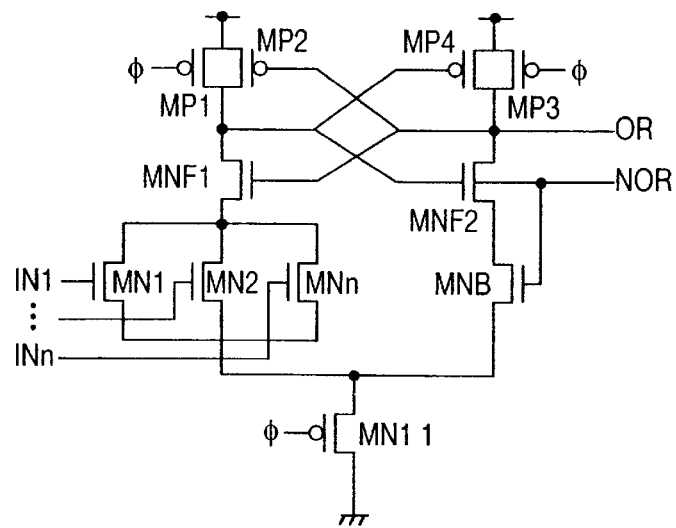
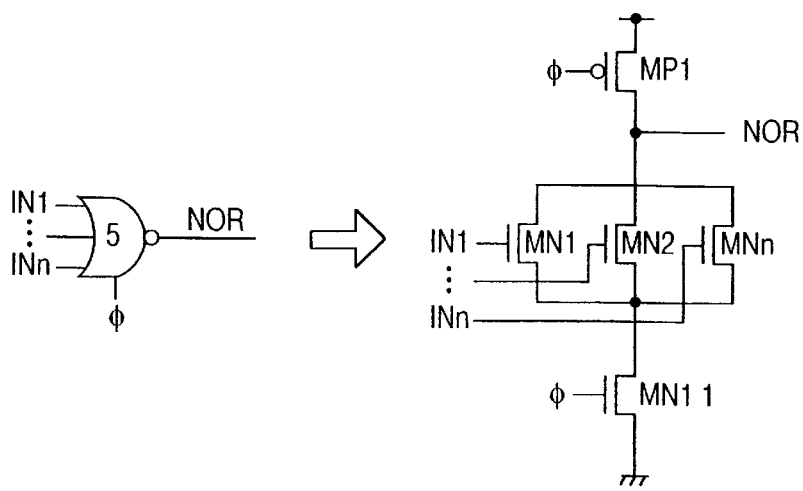

SEMICONDUCTOR INTEGRATED CIRCUIT AND SEMICONDUCTOR LOGIC CIRCUIT USED IN THE INTEGRATED CIRCUIT

BACKGROUND OF THE INVENTION

The present invention relates to a semiconductor integrated circuit which is suitable for speeding up a decoder circuit of a semiconductor memory, for example, and reducing the power consumption, and also to a semiconductor logic circuit used for the semiconductor integrated circuit.

In a semiconductor memory, which is an example of a semiconductor integrated circuit, a decoder circuit shown in FIG. 16 is heretofore used. As shown in FIG. 16, BU denotes an address buffer, PD denotes a predecoder, DD denotes a main decoder, A10 to A32 denote address input, XB1 to XB3 denote the output of a buffer (or a buffer output line), XPD1 to XPD3 denote the output of a predecoder (or a predecoder output line), W1 to W512 denote a word line, denotes an inverter, 2 denotes a static NAND logic circuit, 3 denotes a dynamic NAND logic circuit, and φ denotes a control signal. In FIG. 16, a circuit configuration including 512 word lines is shown. Reference numbers 1 to 3 denote a general inverter and NAND logic circuits respectively composed by a complimentary field effect transistor (an N-type transistor and a P-type transistor), shown in FIG. 17. It is assumed that a transistor is a metal oxide silicon field effect transistor (a MOS transistor), and it will be described below.

As shown in FIG. 16, the buffer output line XB1 is switched to a high level or a low level, according to the level of electric potential of each address input A10 to A12. A control signal φ is inputted to the NAND logic circuit 3 in the predecoder PD at a time that is a little delayed from the buffer output XB1. A phase in which the control signal φ at a low level is a precharge phase, and a phase in which it is at a high level is an evaluation phase. Therefore, when a control signal φ is switched from a low level to a high level and enters an evaluation phase, the output of the NAND logic circuit 3, to which only one buffer output signal at a high level is inputted, changes from a high level to a low level. Also, one of the predecoder output lines XPD1 is switched from a low level to a high level via the inverter and is selected.

Similarly, the buffer output line XB2 is switched to a high level or a low level, according to the level of electric potential of each address input A20 to A22. The output of the NAND logic circuit 2, to which only one buffer output signal at a high level is inputted changes to a low level, and one of the predecoder output lines XPD2 is switched to a high level via the inverter, and is selected. Similarly, one of the predecoder output lines XPD3 is switched to a high level according to the level of electric potential of each address input A30 to A32, and is selected. The output of the NAND logic circuit 3 in the main decoder, to which only one signal at a high level output from the predecoder is inputted, changes to a low level, and one of the word lines W1 to W512 is switched to a high level via the inverter, and is selected.

In a conventional type circuit, at least two columns of inverters are required to acquire the true address input and a complementary signal for a buffer output line. In FIG. 16, four columns of inverters are shown in the address buffer BU. The third and fourth columns of inverters are provided in order for a driver to acquire the true signal and a complementary signal to the buffer output line. The second column of inverter is provided for driving the inverters, and the first column of inverter is provided for shaping the input. In the meantime, as for the NAND logic circuits 2 and 3 shown in FIG. 16, the higher the number of inputs, is as shown in FIG. 17, the higher the number of the columns of N-type transistors MN1 to MNn for pulling down the output will be (on-state resistance is increased), and the speedup of circuit operation is prevented.

SUMMARY OF THE INVENTION

The object of the present invention is to provide a semiconductor logic circuit wherein the number of columns of transistors for pulling down at an output node is small, even if the number of inputs is high and the true output signal and its complementary output signal having approximately the same delay time are acquired. The object is also to speed up a decoder circuit by the above semiconductor logic circuit, and to reduce the power consumption of the decoder circuit.

The speeding up of the decoder circuit, which is one of the above objects, is achieved by using a semiconductor logic circuit controlled for precharge and evaluation operation according to the polarity of a control signal input to its control terminal, and having a configuration such that the number of columns of transistors for pulling down at an output node is at most 2 or 3, even if the number of input signals (inputs) is high. The true output signal and a complementary output signal having approximately the same delay time are acquired and the electric potential of either of the above outputs is used as a reference electric potential for the above input signals for either circuit configuring the decoder circuit. The reduction of the power consumption of the decoder circuit is achieved by controlling the control terminal of the semiconductor logic circuit used for a predecoder or a main decoder by a signal output from the preceding circuit. dr

BRIEF DESCRIPTION OF THE DRAWINGS

FIG. 13 are circuit diagrams showing an example of the logic circuit that can be used in the above embodiments;

DESCRIPTION OF THE PREFERRED EMBODIMENTS

Figure 15:
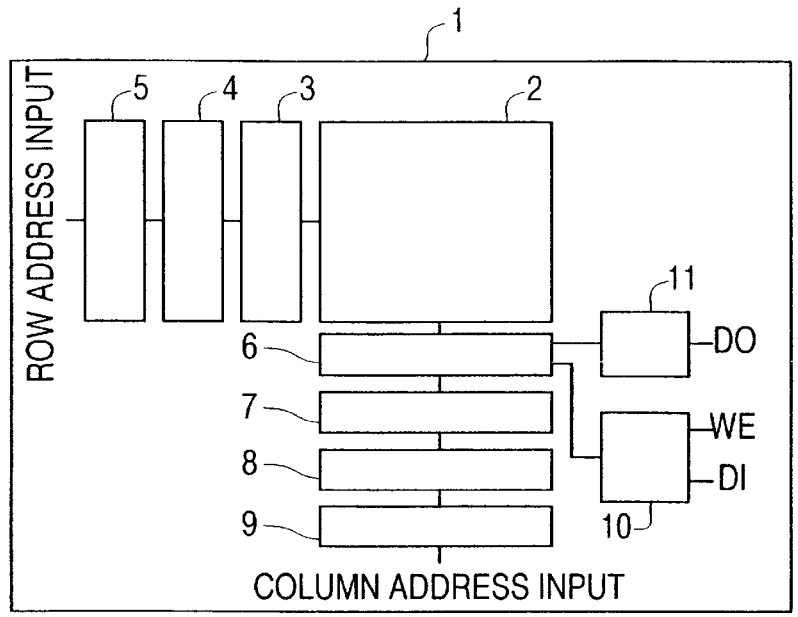
FIG. 15 is a block diagram wholly showing the semiconductor memory which is an example of the semiconductor integrated circuit according to the present invention.

A semiconductor memory which is an example of a semiconductor integrated circuit according to the present invention is shown in its entirety in FIG. 15. The semiconductor memory 1 shown in FIG. 15 is provided with a memory cell array 2, a row main decoder 3, a row predecoder 4, a row address buffer 5, a sense circuit 6, a column main decoder 7, a column predecoder 8, a column address buffer 9, a reading/writing control circuit 10 and an output buffer 11.

The memory cell array 2 is provided with multiple memory cells, the memory cell selecting terminal of each of which is connected to a word line, the data output terminal of each of which is connected to a bit line, and the memory cells are arranged in a matrix. The row address buffer 5 converts a row address signal to an internal complementary address signal, and the row predecoder 4 decodes the internal complementary address signal. Further, the row main decoder 3 decodes it and drives the word line selected as a result so that the word line is at a selected level. The column address buffer 9 converts a column address signal to an internal complementary address signal, the column predecoder 8 decodes the internal complementary address signal and further, the column main decoder 7 decodes it. A bit line is selected according to the result of the decoding by the column main decoder 7. As described above, a memory cell specified by a row address signal and a column address signal is selected.

Figure 1:
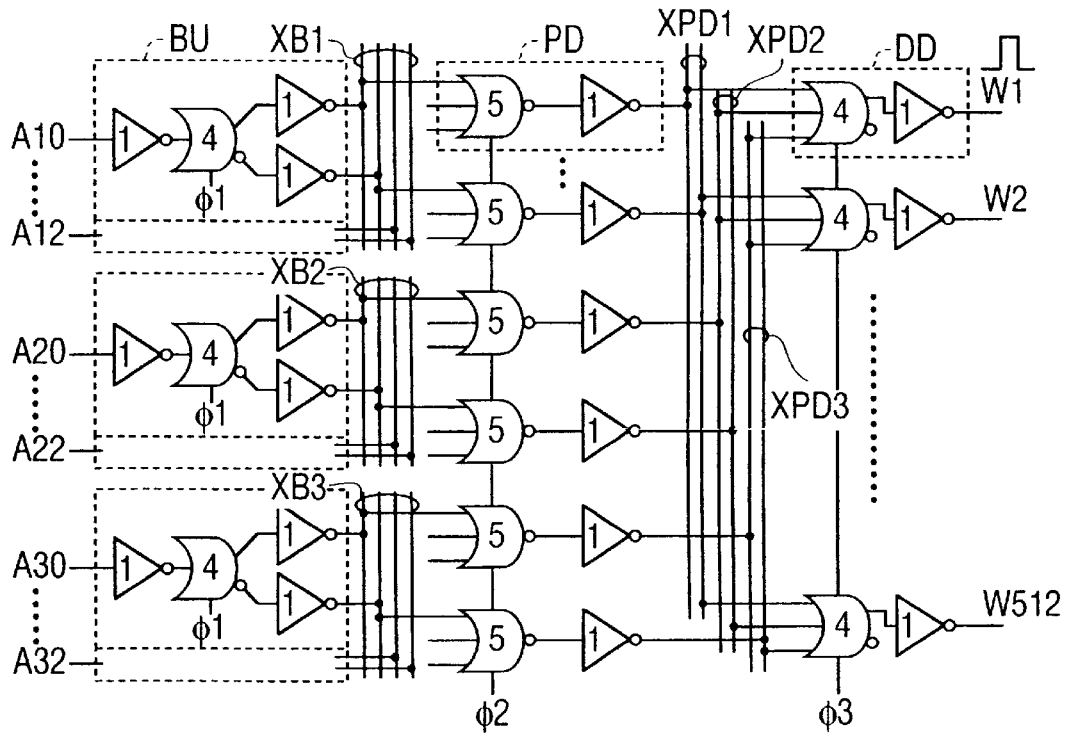
FIG. 1 is a logic diagram showing a first embodiment of a decoder circuit included in a semiconductor memory, which is an example of a semiconductor integrated circuit according to the present invention.

In FIG. 1, as a first embodiment of the present invention, a detailed example of the decoder circuits 3, 4, 5 or 7, 8 and 9 in the semiconductor memory shown in FIG. 15 is shown. As shown in FIG. 1, a reference number 4 denotes a source-coupled-logic circuit (hereinafter called an SCL circuit), 5 denotes a dynamic NOR logic circuit, $\phi 1$ to $\phi 3$ denote a control signal, and the others are similar to those in the above conventional type circuit, shown in FIG. 16.

The details of the SCL circuit 4 are disclosed in Japanese published unexamined patent application No. Hei 10-150358 and in the U.S. Pat. No. 5,291,076 and U.S. Pat. No. 5,373,203. Its basic circuit is shown in FIG. 13. In the SCL circuit 4 shown in FIG. 13(a), each source of N-type transistors for input MN1 to MNn and the source of an N-type transistor for reference MNB are connected to each other and are then connected to the drain of an N-type transistor for the evaluation MN11. Each drain of MN1 to MNn is connected to each drain of a P-type transistor for precharge MP1, and to each drain of a P-type transistor for level compensation MP2. Similarly, the drain of the transistor MNB is connected to each drain of a 2-type transistor for precharge MP3, and to each drain of a P-type transistor for level compensation M24. A control signal $\phi$ is inputted to each gate of the transistors MN11, MP1 and MP3. Output terminals are shown by OR and NOR and output signals having approximately the same delay time are acquired. The gate of the above transistor MNB is connected to the NOR output. As shown in FIG. 13(a), it is clear that in the SCL circuit 4, the number of columns of N-type transistors for pulling down output is 2, even if the number of inputs is high.

In the meantime, as for the SCL circuit 4 shown in FIG. 13(b), a first N-type transistor for feedback MNF1 is added between the output terminal NOR and the transistors MN1 to MNn, and a second N-type transistor for feedback MNF2 is added between the output terminal OR and the transistor MNB, as compared with the configuration shown in FIG. 13(a). The gate of the first N-type transistor for feedback MNF1 is connected to the output terminal OR, and the gate of the second N-type transistor for feedback MNF2 is connected to the output terminal NOR. This configuration is characterized in that, at first, output data during a evaluation phase is latched, second, the degree of voltage amplification is large and reference electric potential for input electric potential is high as a latch-type sense amplifier, and input electric potential which is lower by more than approximately 0.2 to 0.3 V than the high electric potential is identified as low electric potential. Therefore, even if the amplitude of an input signal is at a low amplitude, the transistor can be operated, and the time during which an input signal is transmitted is reduced, or a driving circuit is integrated into a small transistor. In other words, it can be said that the latch-type SCL circuit is more advantageous in terms of speedup by virtue of the method of driving an input signal line so that it is at a high electric potential in precharge and driving it so that it is kept at a high electric potential or it is switched from a high electric potential to a low electric potential in evaluation than its reverse method. However, in a case shown in FIG. 13(b), there are three columns of N-type transistors for pulling down output is three.

A detailed circuit diagram of the dynamic NOR logic circuit 5 is similarly shown in FIG. 13. The dynamic NOR logic circuit 5 is a known circuit heretofore, and each drain of N-type transistors MN1 to MNn for input is connected to the drain of a P-type transistor MP1 for precharge, and each source of the transistors NM1 to MNn is connected to the drain of an N-type transistor for evaluation MN11. Each gate of the transistors MP1 and MN11 is controlled by a control signal φ.

Next, the operation of the decoder circuit shown in FIG. 1 will be described. A phase in which the control signals φ1 to φ3 are at a low level is a precharge phase, and a phase in which they are at a high level is a evaluation phase. During the precharge phase, the output of the SCL circuit 4 and the dynamic NOR logic circuit 5 is precharged so that it is at a high level. When the control signal φ1 is switched from a low level to a high level and enters the evaluation phase, each output of the SCL circuit 4 in the address buffer BU, to which address inputs A10 to A12 are inputted changes from a high level to a low level or is kept at a high level according to the level of electric potential of address inputs A10 to A12, and the buffer output line XB1 is switched from a low level to a high level or is kept at a low level via the inverter. The control signal φ2 is inputted to the dynamic NOR logic circuit 5 in the predecoder PD at a time which is a little delayed from the buffer output signal XB1, and the dynamic NOR logic circuit enters an evaluation phase. At this time, output from the dynamic NOR logic circuit 5, to which only one buffer output signal at a low level is inputted, is kept at a high level, the predecoder output line XPD1 is kept at a low level via the inverter and is selected. The other seven outputs of the dynamic NOR logic circuit 5 change from a high level to a low level, and seven of the predecoder output lines XPD1 are switched from a low level to a high level via the inverter and are not selected.

Similarly, one of the predecoder output lines XPD2 is kept at a low level according to the level of electric potential of the address inputs A20 to A22, and is selected. Also, one of the predecoder output lines XPD3 is kept at a low level according to the level of electric potential of the address inputs A30 to A32 and is selected. The control signal φ3 is inputted to the control terminal of the SCL circuit 4 in the main decoder DD at a time which is a little delayed from signals XPD1 to XPD3, output from the predecoder and the SCL circuit enters an evaluation phase. At this time, the OR output of the SCL circuit 4, to which only one predecoder output signal at a low level is input changes, from a high level to a low level, one of the word lines W1 to W512 is switched from a low level to a high level via the inverter and is selected.

Figure 16:
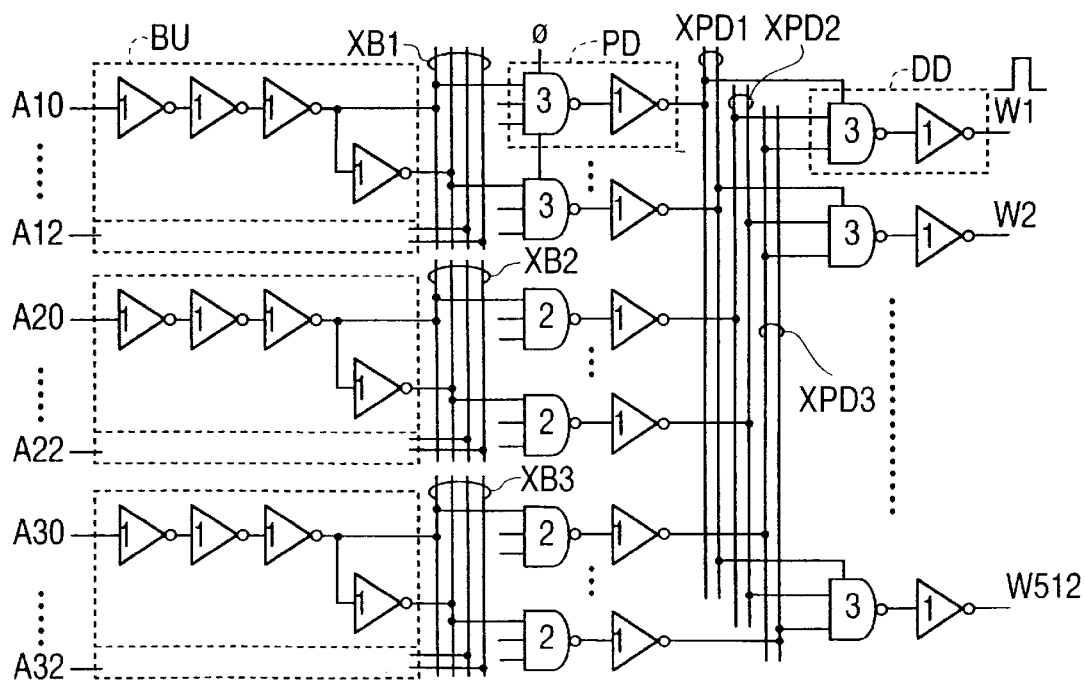
FIG. 16 is a logic diagram showing an example of a conventional type decoder circuit.

As described above, in the above conventional type circuit shown in FIG. 16, the address buffer BU is composed by four columns of gates, while in this embodiment, a similar performance can be acquired by three columns of gates by reducing by one column. The NAND logic circuits 2 and 3 in the predecoder PD and the main decoder DD in the above conventional type circuit are respectively composed of three or four columns of N-type transistors for pulling down output, while in this embodiment, the dynamic NOR logic circuit composed of two columns and the SCL circuit composed of two columns (or three columns) are provided. As described above, the speedup of the decoder circuit is achieved. In this embodiment, when the control signal φ2 is switched from a low level to a high level and enters an evaluation phase, only the selected one of the output of the dynamic NOR logic circuit 5 in the predecoder PD is kept at a high level, and the unselected seven are switched from a high level to a low level. Therefore, the unselected dynamic NOR logic circuits 5 and the respective next inverters are operated and power is consumed. As three sets are provided in the whole predecoder, 21 dynamic NOR logic circuits 5 and the respective next inverters are operated and power consumption is increased by more than that in the conventional type circuit (if the current state is returned to a precharged state, the above 21 pieces are also operated). When the control signal φ3 is switched from a low level to a high level and enters an evaluation phase, the selected one of the OR outputs of the SCL circuit 4 in the main decoder DD (output on the side connected to the next circuit) is switched from a high level to a low level and power is consumed. Also, simultaneously, the NOR output (output on the side not connected to the next circuit) of the unselected 511 SCL circuits 4 is switched from a high level to a low level and power is consumed. That is, all 512 SCL circuits are operated and consumed power is increased by more than that in the conventional type circuit (if the current state is returned to a precharged state, all 512 are operated). As described above, this embodiment is not configured by the conventional type NAND logic circuit and consumed power is increased. An embodiment in which consumed power is reduced, as compared with that in this embodiment, will be described below.

Figure 2:
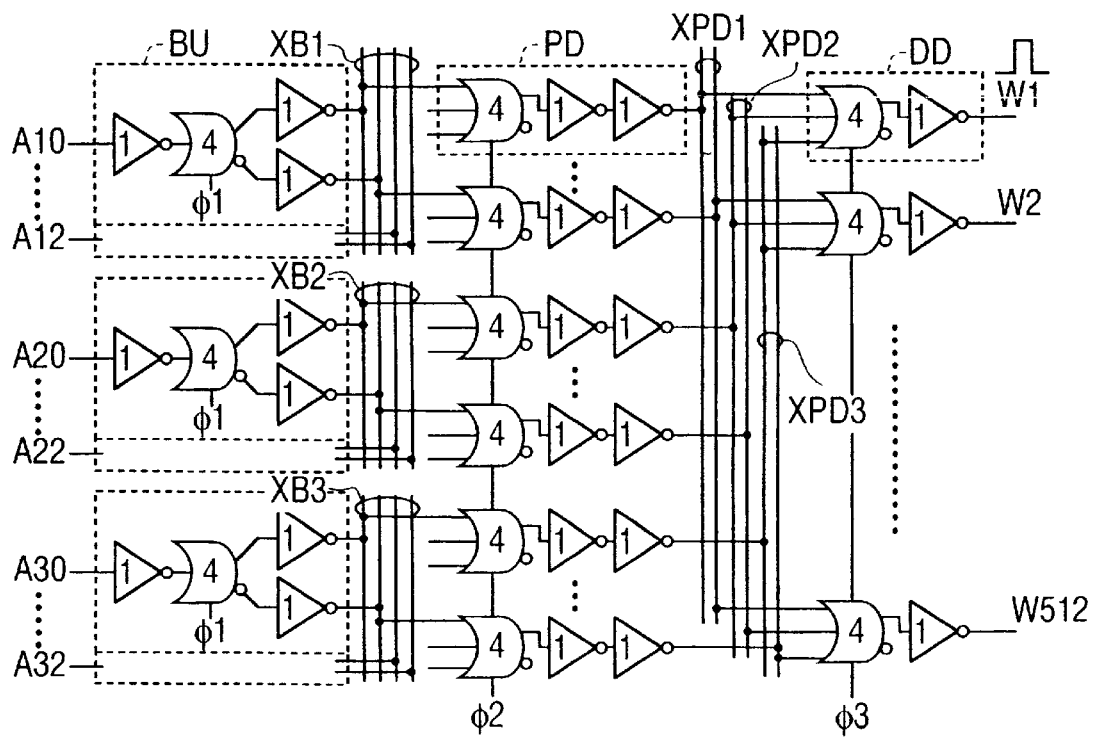
FIG. 2 is a logic diagram showing a second embodiment of the decoder circuit.

FIG. 2 shows a second embodiment of the present invention. This embodiment is different from the first embodiment in that a predecoder PD is composed of an SCL circuit 4 and two columns of inverters 1. In this embodiment, OR output (output on the side connected to the next circuit) of the SCL circuit 4 in the predecoder PD, to which only one buffer output signal at a low level is inputted, is switched from a high level to a low level and is selected. In the meantime, seven NOR outputs (output on the side not connected to the next circuit) of unselected SCL circuits are switched from a high level to a low level.

However, OR output is kept at a high level and the next inverter (in the series of address inputs A10 to A12) is not operated. As a result, all 24 SCL circuits are operated in the whole predecoder, but, the number of the next operated inverters is reduced from 21 to 6 and power consumption is reduced. However, the delay time of one column of inverters is increased, as compared with that in the first embodiment.

Figure 3:
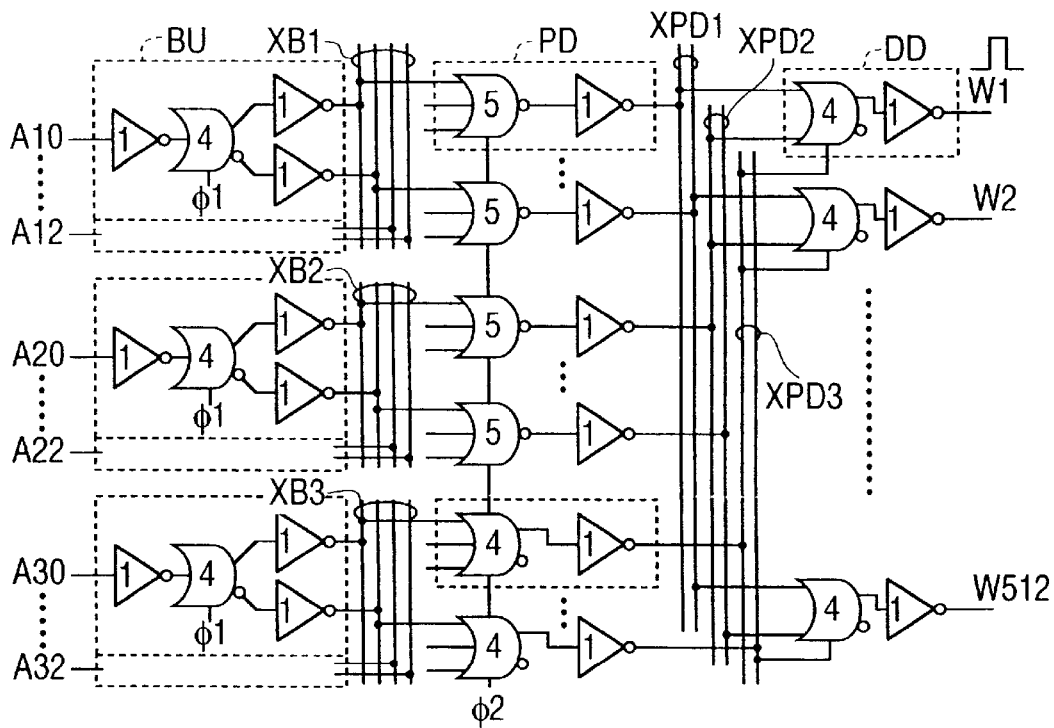
FIG. 3 is a logic diagram showing a third embodiment of the decoder circuit.

FIG. 3 shows a third embodiment of the present invention. This embodiment is different from the first embodiment in that a predecoder output signal XPD3 is utilized in place of a control signal φ3 for the main decoder DD. In this embodiment, OR output of an SCL circuit 4 in a predecoder PD, to which only one buffer output signal at a low level of eight buffer output signals XB3 is inputted is switched from a high level to a low level and is selected. One of the predecoder output lines XPD3 is switched from a low level to a high level via an inverter and is selected. As such signals are used, the number of the SCL circuits operated in a main decoder DD is reduced by up to $\frac{1}{8}$ ($^{512}/_8$=64 pieces), and power consumption is reduced. Also, in this embodiment, as a control signal φ3 is not required, a control signal (internal clock) generation circuit is simplified. Also, a predecoder output signal XPD3 is required to be inputted at a time which is a little delayed from the predecoder output signals XPD1 and XPD2. However, this can be solved by reducing the load driving capacity of the predecoder for generating a signal XPD3 by a little.

Figure 4:
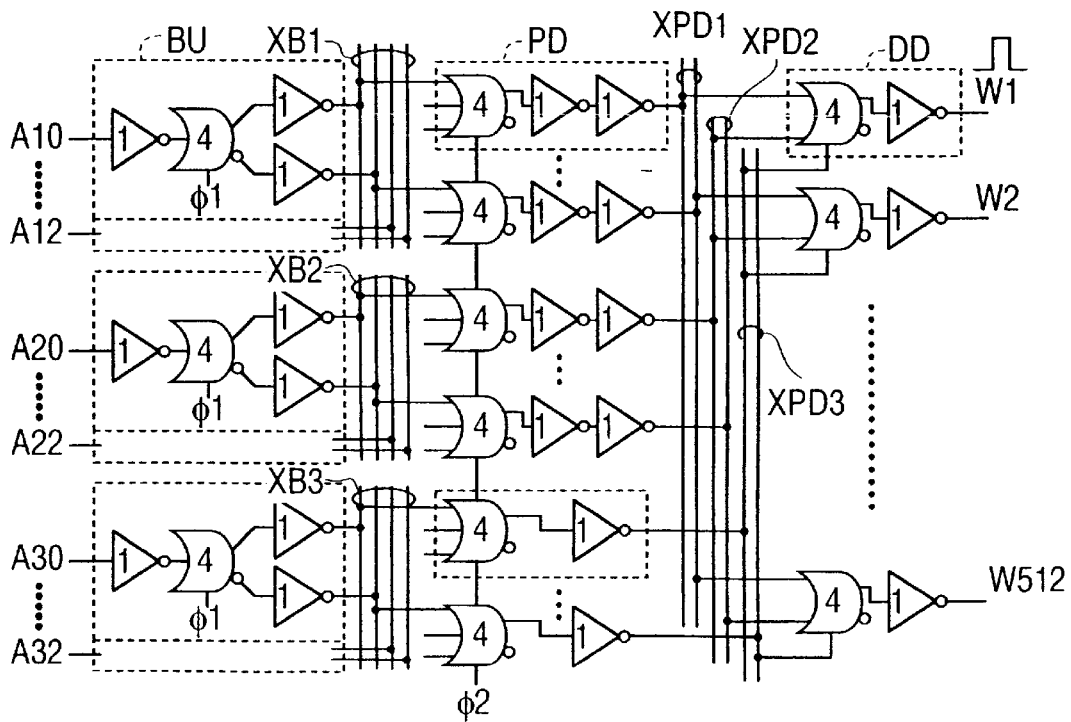
FIG. 4 is a logic diagram showing a fourth embodiment of the decoder circuit.

FIG. 4 shows a fourth embodiment of the present invention. This embodiment differs from the above third embodiment only the configuration of a predecoder PD for generating predecoder output signals XPD1 and XPD2. In this embodiment, the predecoder PD described in the second embodiment, shown in FIG. 2, the power consumption of which is small, is used and power consumption is further reduced, as compared with that in the third embodiment.

Figure 5:
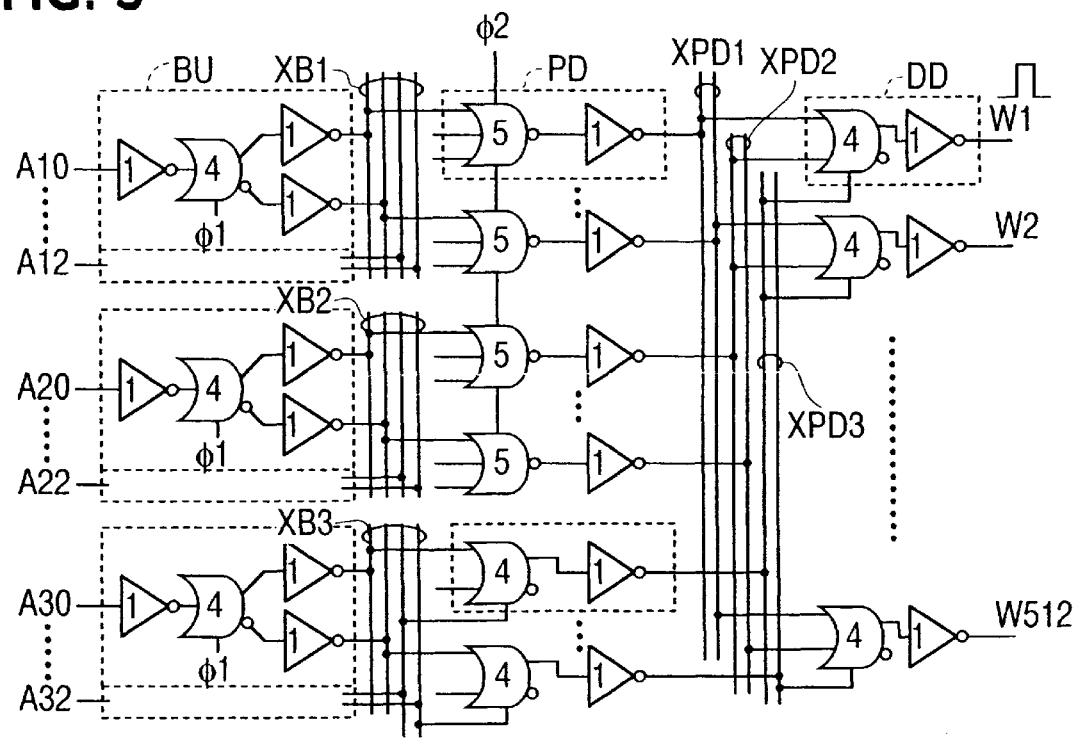
FIG. 5 is a logic diagram showing a fifth embodiment of the decoder circuit.

FIG. 5 shows a fifth embodiment of the present invention. This embodiment is different from the third embodiment shown in FIG. 3, in that in place of a control signal $\phi 2$ to a predecoder PD for generating a predecoder output signal XPD3, a buffer output signal XB3 is utilized. That is, as a signal on the buffer output line XB3 (one of two is selected and is switched from a low level to a high level), selected based upon the electric potential of address input A32, is used, the number of operated SCL circuits in the predecoder PD is reduced by up to ½ (⁸⁄₂=4 pieces) and power consumption is reduced.

Figure 6:
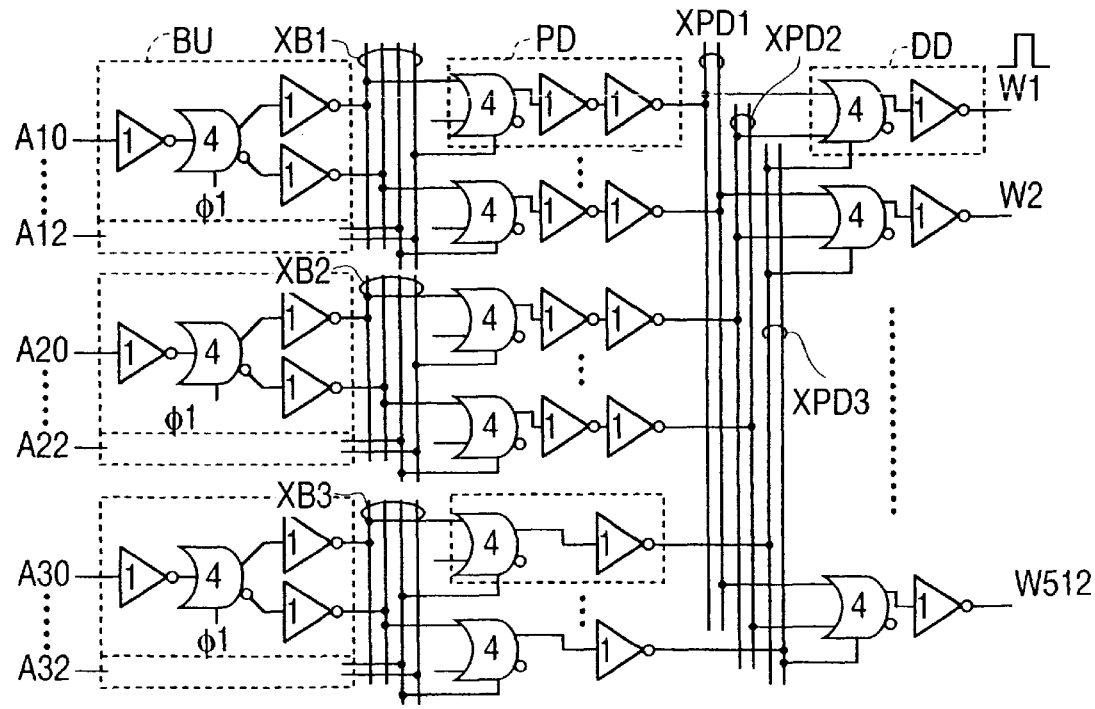
FIG. 6 is a logic diagram showing a sixth embodiment of the decoder circuit.

FIG. 6 shows a sixth embodiment of the present invention. This embodiment is different from the above fifth embodiment in the configuration of a predecoder PD for generating predecoder output signals XPD1 and XPD2. In this embodiment, the predecoder PD described in the second embodiment, shown in FIG. 2, is used. Therefore, as described in the second embodiment, there is the effect that the power consumption is reduced. Further, each signal on buffer output lines XB1 and XB2 (one of two is respectively selected and is switched from a low level to a high, level), generated based upon the electric potential of address inputs A12 and A22, is utilized in place of a control signal $\phi 2$. Therefore, the number of operated SCL circuits in the predecoder PD is respectively reduced by to ½ (each ⁸⁄₂=4 pieces) and power consumption is further reduced, as compared with that in the above fifth embodiment. Also, as control signals $\phi 2$ and $\phi 3$ are not required, a control signal (internal clock) generation circuit is simplified. However, the delay time of one column of inverters is increased, as compared with that in the fifth embodiment.

Figure 7:
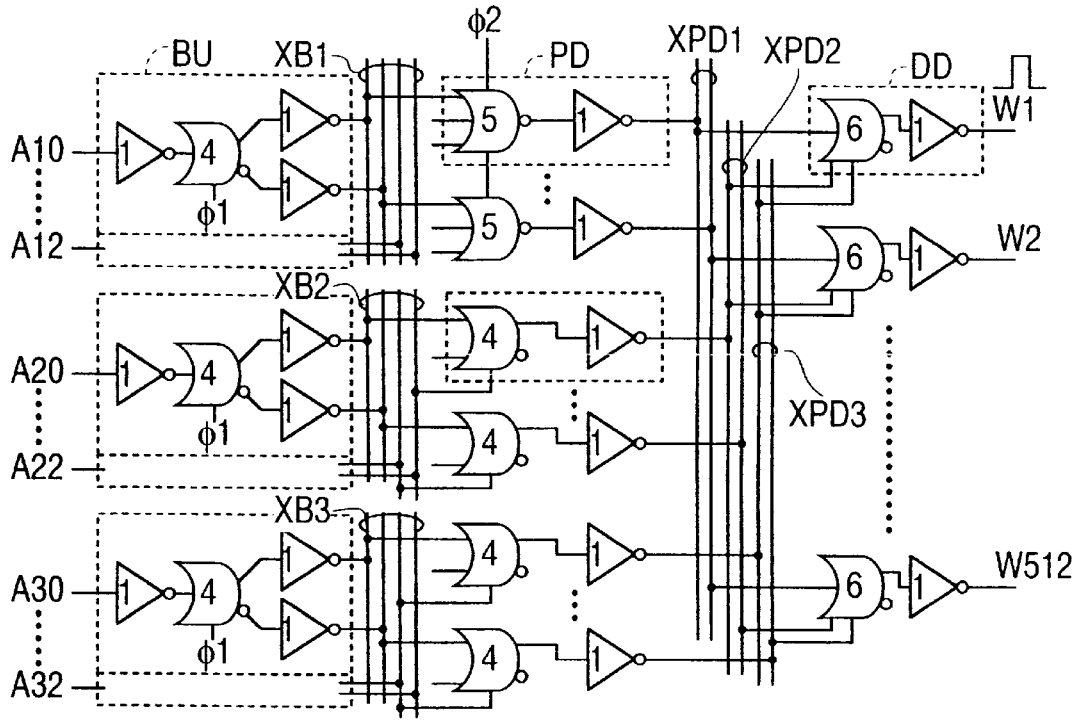
FIG. 7 is a logic diagram showing a seventh embodiment of the decoder circuit.
Figure 14:
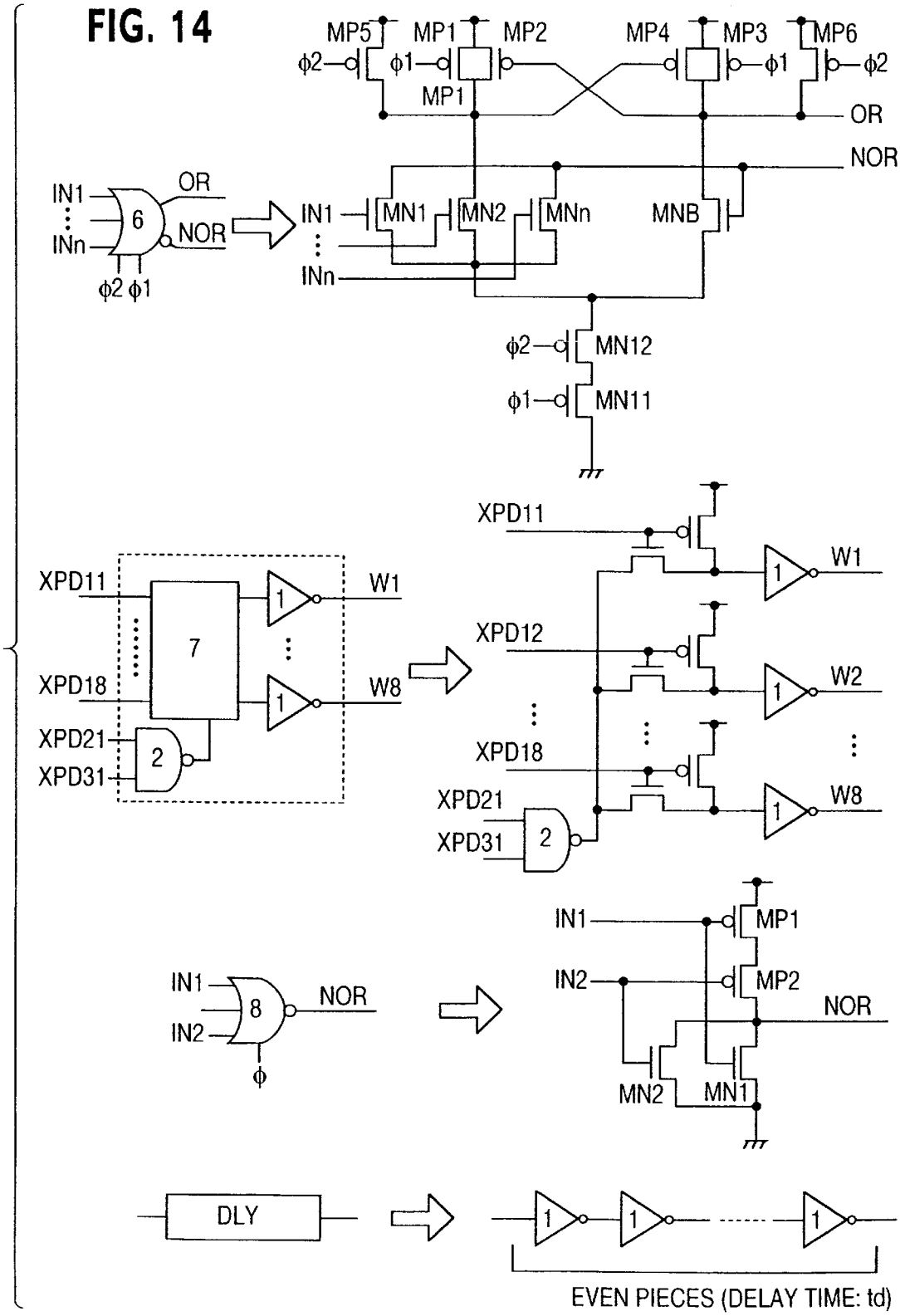
FIG. 14 is a circuit diagram showing another example of the logic circuit which can be used in the above embodiments.

FIG. 7 shows a seventh embodiment of the present invention. This embodiment is different from the fifth embodiment shown in FIG. 5, in that an SCL circuit 6 provided with two control signal terminals is used in place of the SCL circuit 5 in the main decoder DD. Also, predecoder output lines XPD2 and XPD3 are respectively connected to the terminals for a control signal. FIG. 14 shows the detailed circuit diagram of the SCL circuit 6. As for the SCL circuit 6 shown in FIG. 14, an N-type transistor for evaluation MN12 and P-type transistors for precharge MP5 and MP6 are added to the SCL circuit 4 shown in FIG. 13(a), and it is clear that two control signals and $\phi 2$ are inputted. As described above, in this embodiment, signals on the predecoder output lines XPD2 and XPD3 (all eight of which are selected and switched from a low level to a high level) are utilized as control signals. As a result, the number of SCL circuits 6 which XPD2 and XPD3 connected thereto which both receive a signal at a high level is reduced up to ¹⁄₆₄ of the whole (⁵¹²⁄₆₄=8 pieces) and power consumption is reduced. It is clear that the configuration provided with two or more control signal terminals as in the SCL circuit 6, is also applied to the SCL circuit 4 shown in FIG. 13(b).

Figure 8:
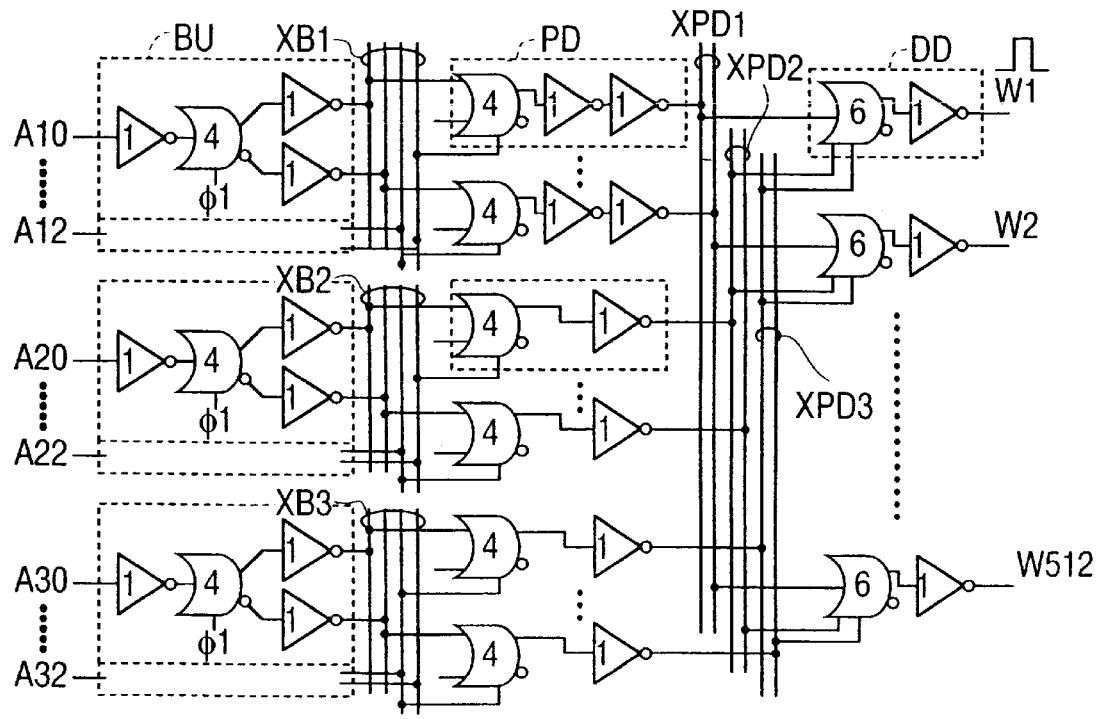
FIG. 8 is a logic diagram showing an eighth embodiment of the decoder circuit.

FIG. 8 shows an eighth embodiment of the present invention. This embodiment is different from the above seventh embodiment only in the configuration of a predecoder PD for generating a predecoder output signal XPD1. In this embodiment, the predecoder PD described in the second embodiment, shown in FIG. 2, is used and power consumption is further reduced, as compared with that in the above seventh embodiment. Also, as control signals $\phi 2$ and $\phi 3$ are not required, a control signal (internal clock) generation circuit is simplified.

Figure 9:
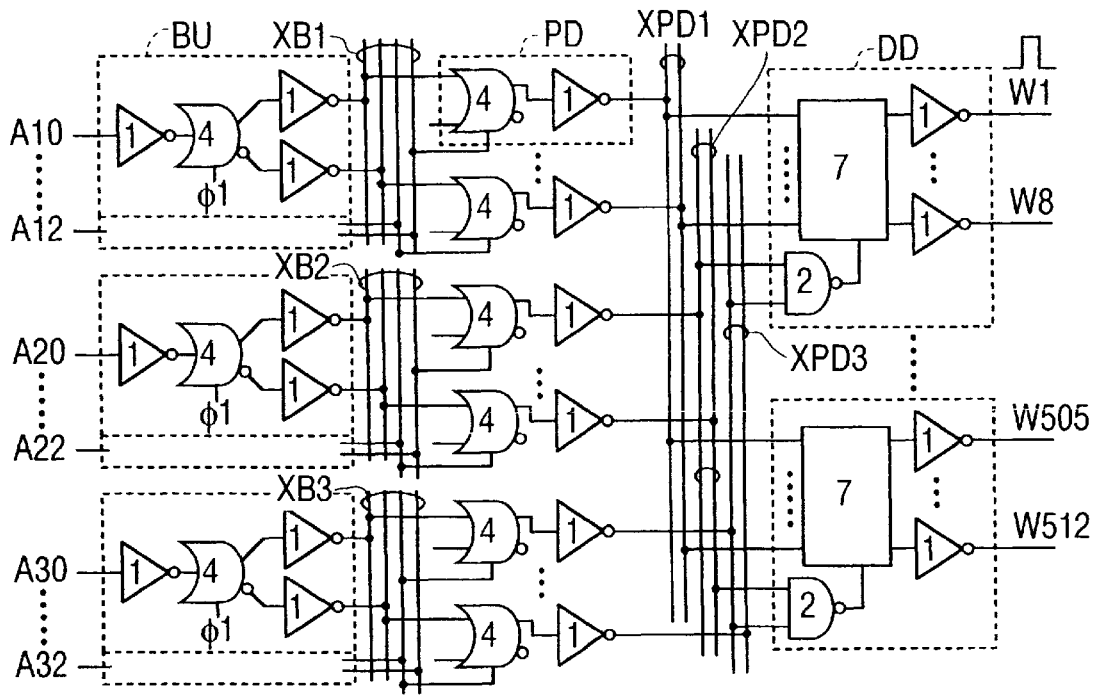
FIG. 9 is a logic diagram showing a ninth embodiment of the decoder circuit.

FIG. 9 shows a ninth embodiment of the present invention. In this embodiment, all predecoders PD are respectively composed of an SCL circuit 4 and an inverter 1, and a part of a buffer output signal is utilized for a control signal to the SCL circuit 4. A main decoder DD is composed of a NAND logic circuit 2 (if the input is one, an inverter may be used), to which a predecoder output signal is inputted, a logic circuit 7, to which an output signal from the NAND logic circuit 2 and a predecoder output signal are inputted and plural inverters 1 to which an output signal from the logic circuit 7 is inputted. The logic circuit 7 is composed of the plural inverters which receive output from each predecoder as shown in FIG. 14.

Figure 17:
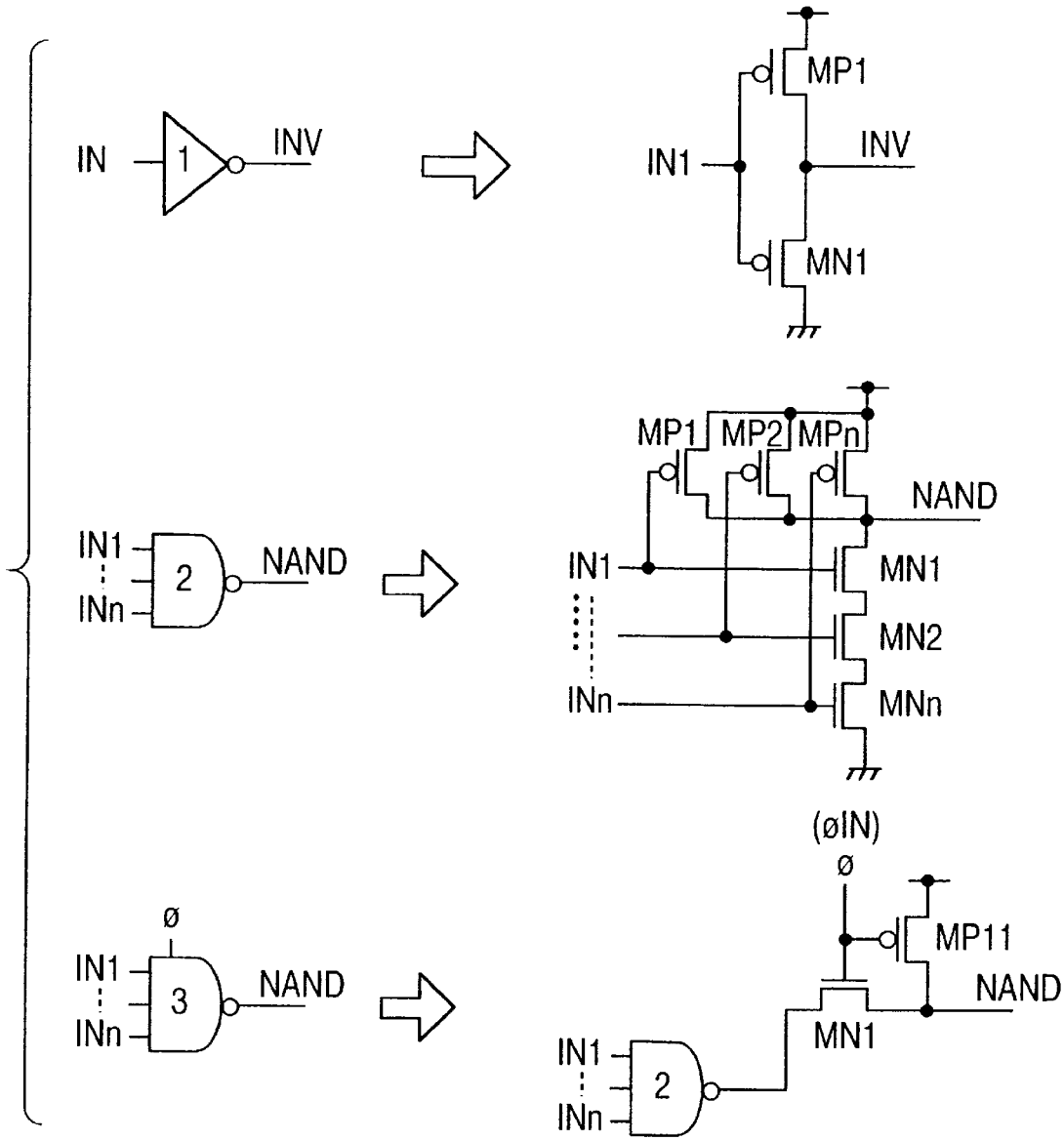
FIG. 17 is a circuit diagram showing an example of the logic circuit used for the conventional type decoder circuit.

The inverter and the source of an N-type transistor are connected in common and are connected to the output terminal of the NAND logic circuit 2. That is, the main decoder DD is provided with plural inverters (MP11 and MN11) composing a dynamic NAND logic circuit 3, shown in FIG. 17. In this embodiment, as in the above sixth and eighth embodiments, as control signals $\phi 2$ and $\phi 3$ are not required, a control signal (internal clock) generation circuit is simplified.

Figure 10:
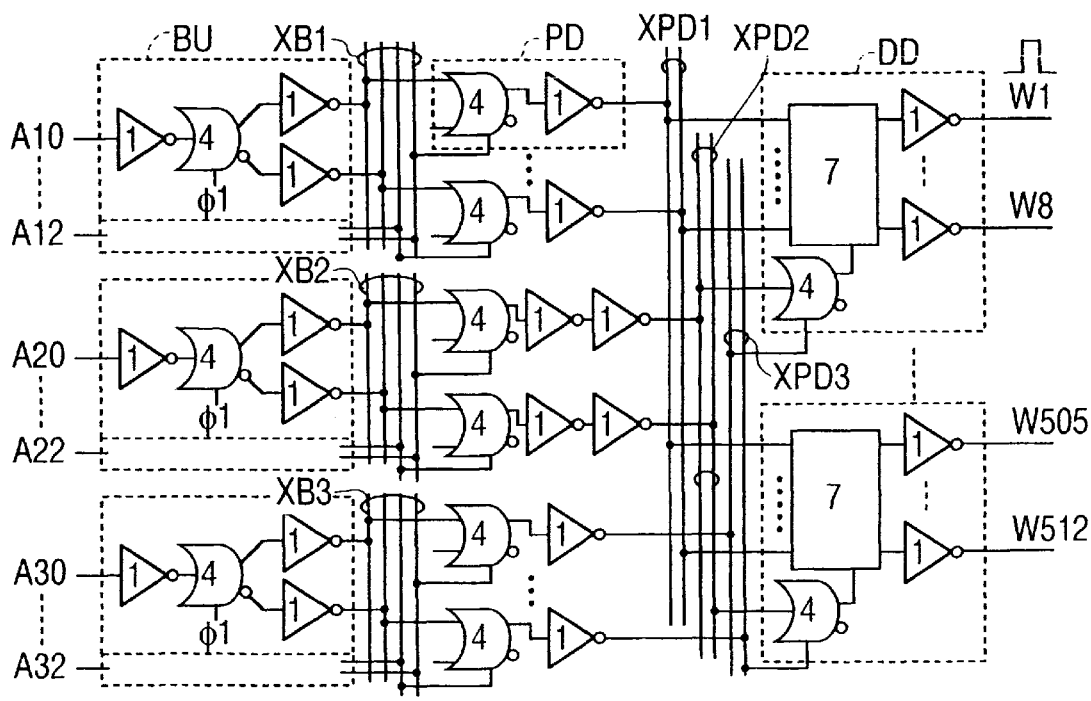
FIG. 10 is a logic diagram showing a tenth embodiment of the decoder circuit.

FIG. 10 shows a tenth embodiment of the present invention. This embodiment is different from the above ninth embodiment in that the NAND-logic circuit 2 in the main decoder DD is replaced with an SCL circuit 4. The SCL circuit 4 is selected when a predecoder output signal XPD3 is at a high level and a predecoder output signal XPD2 is at a low level. If the number of word lines is high, the effect of the speedup acquired by using the SCL circuit 4 becomes more remarkable because of the increase of the number of inputs to the SCL circuit 4 in the main decoder DD (input corresponding to XPD2. A predecoder for XPD2 may be also the predecoder for XPD2, shown in the above first and fifth embodiments.

Figure 18:
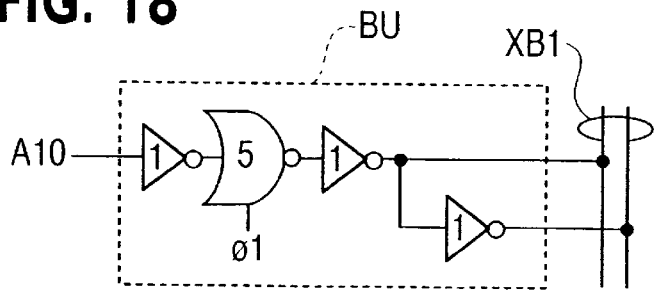
FIG. 18 is a circuit diagram showing an example of a buffer circuit which can be used in the above embodiments.

FIG. 18 shows another example of a buffer circuit BU used in this embodiment. BU denotes a buffer circuit, A10 denotes an address signal, 1 denotes an inverter, 5 denotes a dynamic circuit shown in FIG. 13, (P1 denotes a control signal, and XB1 denotes a buffer output line. In this case, as the dynamic circuit 5 is used, the evaluation operation of this dynamic circuit and the succeeding circuit (an inverter in this example) can be precedently sped up (conversely, the precharge operation is slowed). Therefore, the delay time is reduced, as compared with the buffer circuit shown in FIG. 16, which is the conventional type circuit. As described above, according to the present invention, the operation of a decoder circuit can be sped up and power consumption can be reduced.

Figure 11:
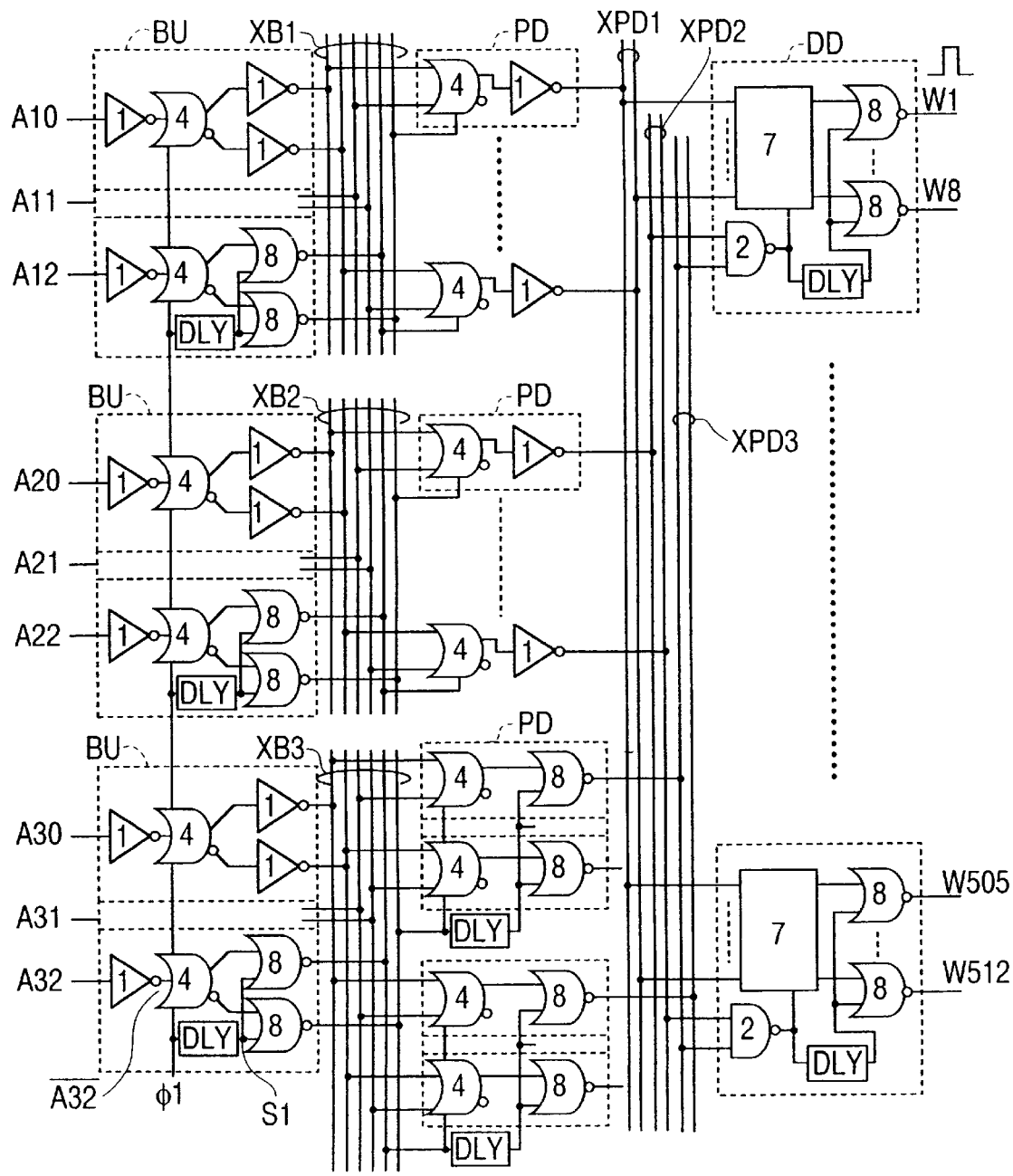
FIG. 11 is a logic diagram showing an eleventh embodiment of the decoder circuit.

FIG. 11 shows an eleventh embodiment of the present invention. In this embodiment, the pulse length of each output signal (at least the signals of the buffer output, predecoder output and main decoder output) is reduced and the high speed cycle operation of a decoder circuit is thus enabled.

Figure 12:
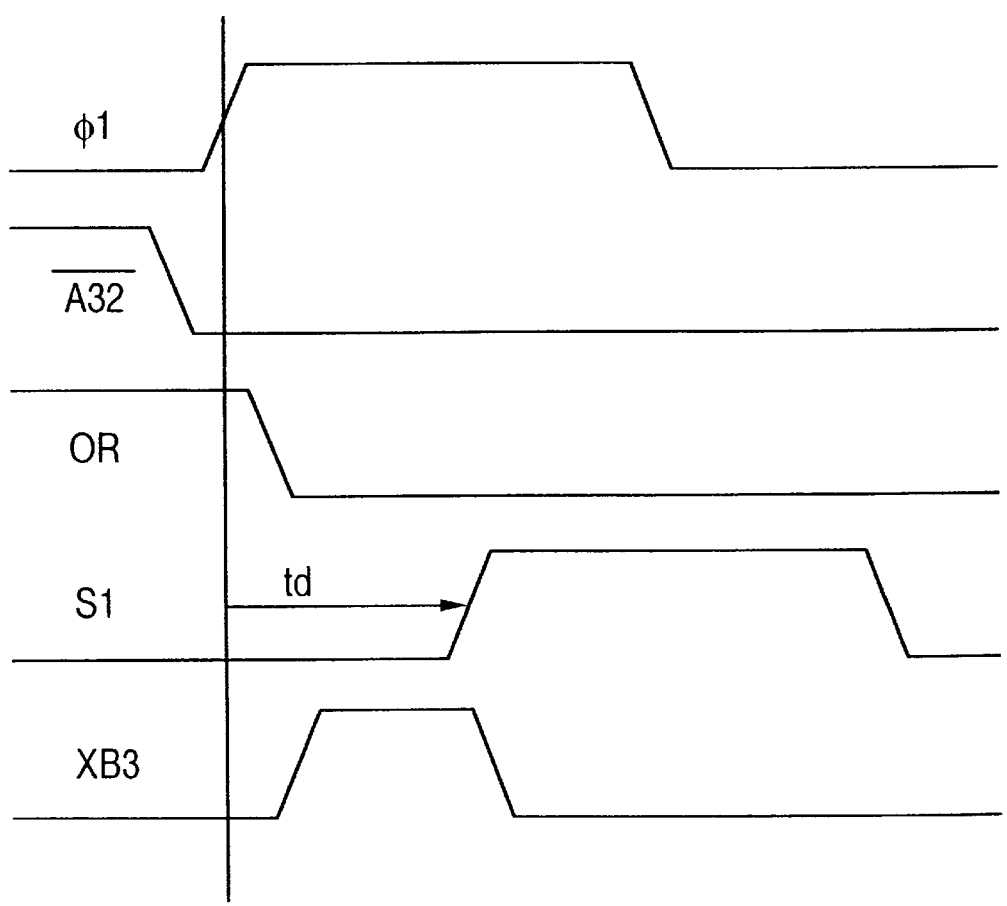
FIG. 12 is a waveform chart showing the operation of the address buffer circuit shown in FIG. 11.

This embodiment, is based upon the above ninth embodiment and a circuit for reducing the pulse length of the above output signal is provided. For example, complementary output signals (OR and NOR) from an SCL circuit 4 in an address buffer BU to which an address signal A32 is inputted and a signal S1 output from a delay circuit after a control signal $\phi 1$ is sent to the delay circuit DLY, are received by a NOR logic circuit 8. The NOR logic circuit 8 is a general circuit, as shown in FIG. 14, and the delay circuit DLY is composed of an inverter for example. It is clear from an operational waveform shown in FIG. 12 that the desired pulse length is controlled, depending upon the delay time td of the delay circuit DLY. As shown in FIG. 11, the predecoder PD and the main decoder DD are also composed of the NOR logic circuit 8 and the delay circuit DLY as the buffer BU. In FIG. 11, an example is shown of when a circuit for reducing the pulse length of the above output signals is applied to a part of the address buffers and a part of the predecoders for simplification. However, there would be no problem even if the above circuit is applied to all address buffers and all predecoders. Also, for example, one delay circuit DLY of the following delay circuits may also be shared by each delay circuit DLY in each address buffer BU for address signals A12, A22 and A32.

Next, referring to FIGS. 19 to 21, a pulse length reduction method described in the above eleventh embodiment will be described in more detail. First, referring to FIG. 19, the configuration of the SCL circuit will be described. Z1 and Z2 denote a loader, LB denotes a logic circuit for input and DV denotes an activation circuit. As for the transistors shown in FIG. 19, MPL and MPR are for precharge, MPFL and MPFR are for level compensation, MN1 is for input, MNB is for reference and MND is for evaluation.

The operation of the SCL circuit will now be described below with reference to a circuit diagram shown in FIG. 19 and an operational explanatory drawing shown in FIG. 20. As shown by a cycle A in FIG. 20, when a control signal $\phi$ is at a low electric potential VSS (a precharge state), transistors for precharge MPL and MPR conduct, and complementary output nodes (Q,/Q), and the gate of a transistor for reference MNB are charged so that they are at a high electric potential VDD. Next, as shown by a cycle B, if the input IN is at a low electric potential when a control signal $\phi$ is switched from low electric potential to high electric potential (an evaluation state), the continuity of the transistor MNB is stronger than that of the transistor MN1. Also, the output node Q is discharged so that it is at a low electric potential and the output node /Q is kept at a high electric potential. However, at the output node /Q, a slight noise Vn1 from switching is caused mainly because of the capacity between the gate and the drain of the transistor MPFL. In the meantime, as shown by a cycle C, if input IN is at a high electric potential, the strength of the continuity of the transistors MN1 and MNB is equal at first, and electric potential at both of the complementary output nodes (Q,/Q) starts to lower. However, when the electric potential at the output node /Q lowers, the continuity of the transistor MN1 becomes stronger than that of the transistor MNB. Therefore, the output node /Q is discharged so that it is finally at a low electric potential and the other output node Q is charged by the transistor for level compensation MPFR so that it is at a high electric potential VDD. The variation of electric potential of the output node Q generated at this time is shown by the noise Vn2 from switching. As described above, slight noise from switching is caused. However, the SCL circuit receives one input signal and can acquire complementary output, the delay time (tpd1 and tpd2 shown in FIG. 20) of which is approximately equal. In conventional type static and dynamic CMOS logic circuits, one column of inverters is added to acquire complementary output or a circuit using an input signal, and its complementary input signal is required (refer to the conventional type examples in Japanese published unexamined patent application No. Hei 10-150358) The SCL circuit is superior in that the delay time is short, as compared with that in these conventional type examples, and no complementary input signal is required.

Next, referring to FIG. 21, an operational cycle will be described. It is assumed that the SCL circuit and the next circuit are designed to reduce delay time so that evaluation operation is fast, and, conversely, precharge operation is slow. Under this condition, the pulse length (tw2) of the output Q of the SCL circuit is longer than that (tw1) of the control signal $\phi$, as shown in FIG. 21. If the next circuit is an inverter, the pulse length (tw3) of the output DO becomes even longer and it is difficult to reduce operational cycle time.

Figure 19:
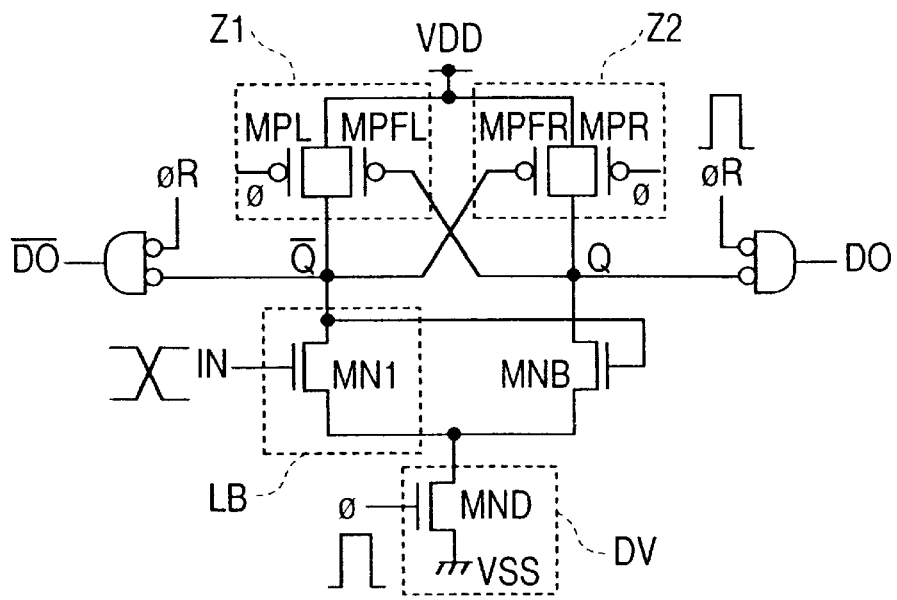
FIG. 19 is a circuit diagram showing an example in which the pulse width is reduced in the eleventh embodiment.

Therefore, as shown in FIG. 19, a NOR circuit is used for the next circuit of the SCL circuit. In this case, the pulse length of the output DO of the NOR circuit is reduced up to the pulse length (tw4), shown in FIG. 21, by a reset pulse (PR from the NOR circuit. That is, the reduction of the operational cycle time is enabled. However, as in the NOR circuit, 2-type MOS transistors are cascaded (two columns in this case), and a large layout area is required. That is, the configuration in the eleventh embodiment is not considered enough to reduce the layout area. As shown in FIG. 21, even if the pulse length (tw4) of the output DO of the NOR circuit is reduced, a case in which the reduction of operational cycle time is limited by the pulse length (tw2) of the output Q of the SCL circuit is conceivable. Next, an embodiment in which a function for reducing the pulse length of an output signal that is provided to an SCL circuit itself to enable high speed cycle operation will be described.

Figure 22:
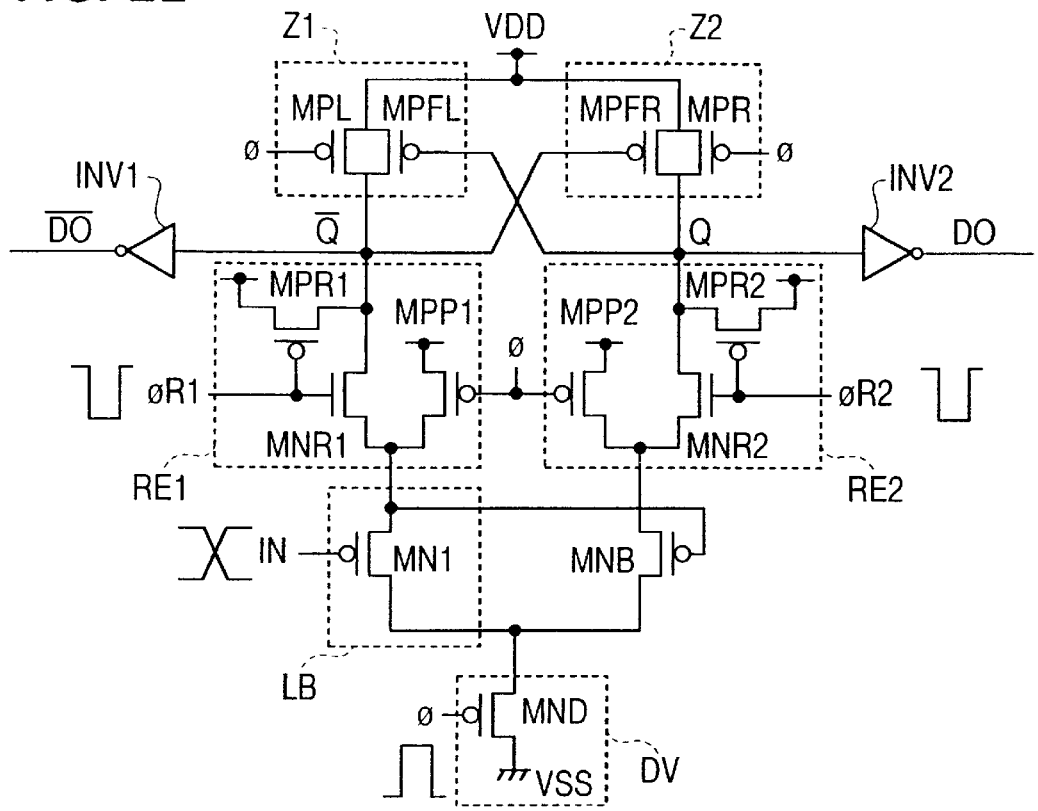
FIG. 22 is a circuit diagram showing a twelfth embodiment.

FIG. 22 shows a twelfth embodiment of the present invention. The SCL circuit in this embodiment is different from the conventional type SCL circuit shown in FIG. 19 in that it is provided with a first reset circuit RE1 between an output node /Q and a logic circuit for input LB, and a second reset circuit RE2 between an output node Q and a transistor for reference MNB. The SCL circuit in this embodiment is also different in that inverters INVL and INV2 are used for the next circuit in place of the NOR circuit. Both of the reset circuits RE1 and RE2 are provided with transistors for reset MPRL and MPR2, transistors for preventing a through state MNRL and MNR2, and transistors for precharge MP21 and MPP2.

Figure 20:
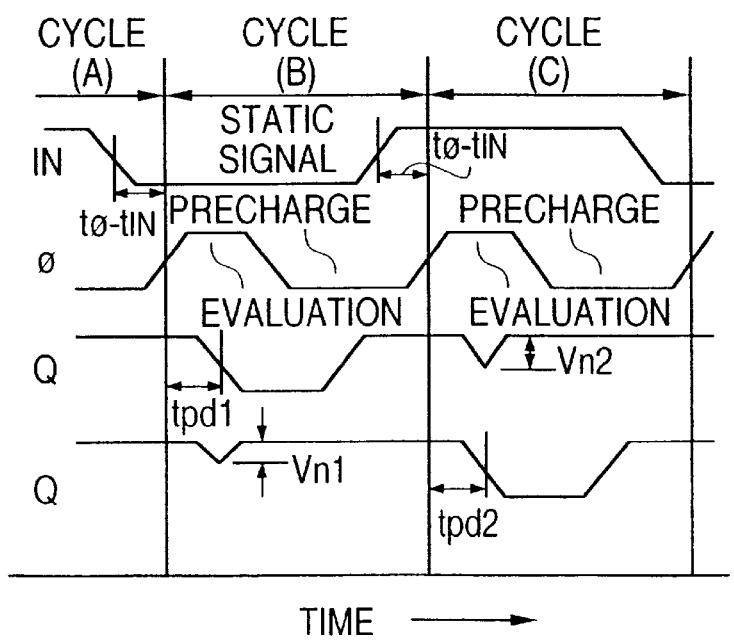
FIG. 20 is an explanatory drawing showing the operation of a conventional type semiconductor logic circuit.
Figure 21:
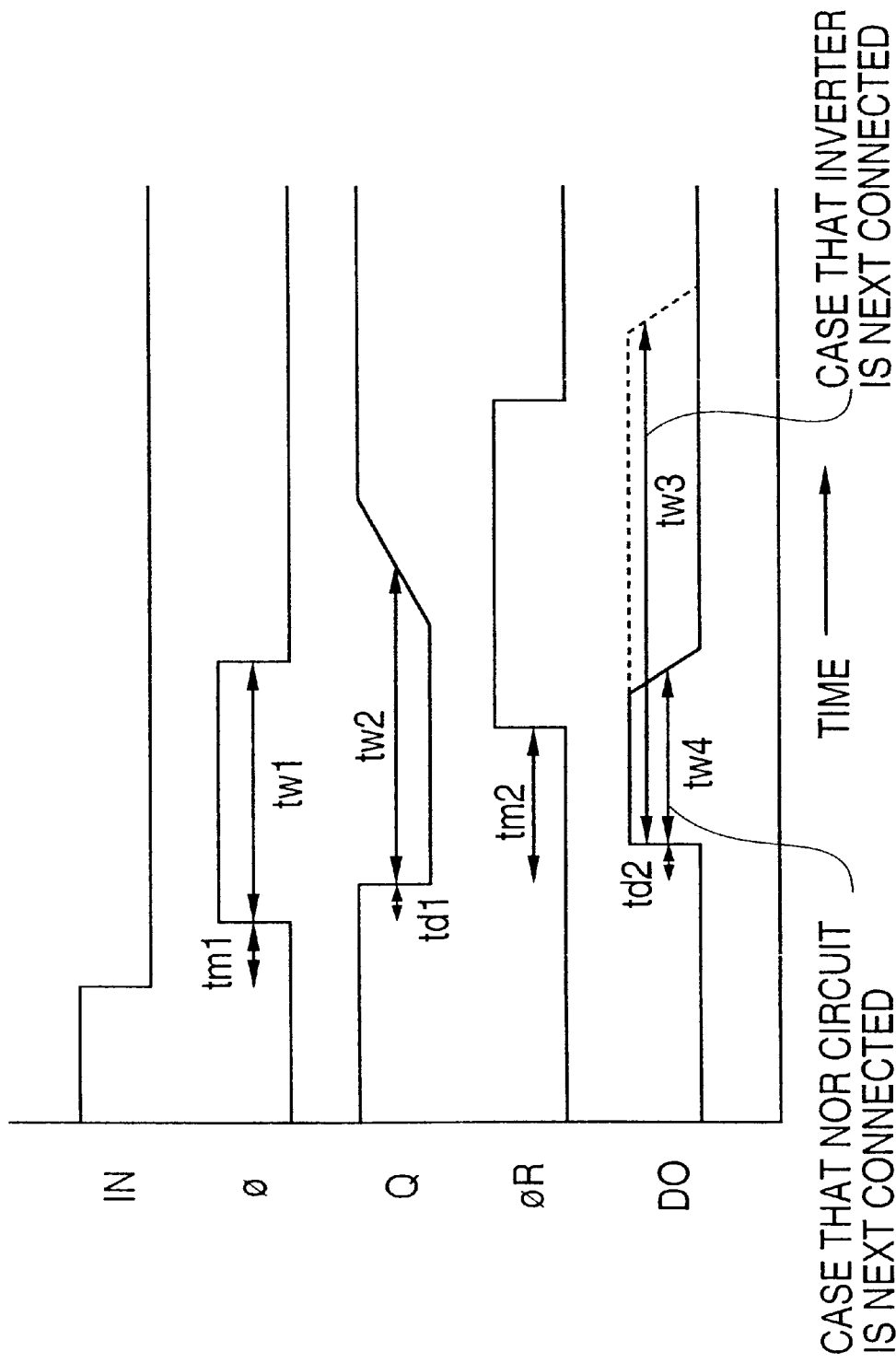
FIG. 21 is an explanatory drawing showing the operation in a case in which pulse width is reduced in the eleventh embodiment.

The basic operation shown in FIG. 20, of the SCL circuit in this embodiment is the same as that of the above conventional type SCL circuit if a control signal $\phi$ is input in a state (at a high electric potential) before reset pulses $\phi$R1 and $\phi$ R2 are inputted. Therefore, referring to FIG. 23, reset operation will be described below. An example of output Q of the outputs (Q, /Q) will be described for simplification. When a control signal (pulse length: tw1) is inputted while an input signal IN is at low electric potential, transistors MND, MNB and MNR2 conduct. Conversely, a transistor MPR in the loader Z2 is turned off and output Q is switched from high electric potential to low electric potential. When a reset pulse ($\phi$R2 is inputted, delayed by fixed time (tm2) after the output Q is switched, the transistor MNR2 in the reset circuit RE2 is turned off. Conversely, the transistor MPR2 is turned on and output Q is charged so that it is at a high electric potential. As a result, the pulse length (tw2) of the output Q in this embodiment is reduced by more than tw2 in the eleventh embodiment, shown in FIG. 21. Therefore, the pulse length (tw3) of the output DO of the next circuit (the inverter INV2) can be equalized to tw4 in the eleventh embodiment, shown in FIG. 21. In the SCL circuit in this embodiment, a reset circuit is added to a conventional type SCL circuit and the number of elements is increased. However, as the NOR circuit requiring relatively large layout area, which is the next circuit can be replaced with an inverter, total layout area is reduced. Further, in the SCL circuit in this embodiment, the noise Vn2 from switching of the output Q shown in the operational explanatory drawing in FIG. 20 of the conventional type SCL circuit is reduced. The reason for this is that in the case of the conventional type SCL circuit, the response speed of the output Q and of a node which is also the node of the output /Q at the gate of the transistor for reference MNB is substantially the same, while in the SCL circuit in this embodiment, the response speed of the node at the gate of the transistor for reference MNB is faster than that of the output Q.

In other words, as the reset circuit is provided, the response speed of the output Q is slower.

As described above, according to this embodiment, as the reduction of operational cycle time is enabled by reducing the pulse length of the output from the SCL circuit and, the NOR circuit in the next circuit can be replaced with an inverter, the layout area also be reduced. Another effect is that the noise from switching at an output node is reduced.

Figure 24A:
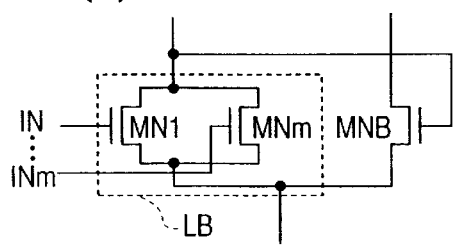
FIG. 24 show another logic circuit for input used in the twelfth embodiment.
Figure 24B:
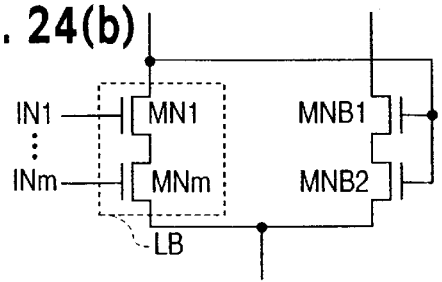
Figure 24C:
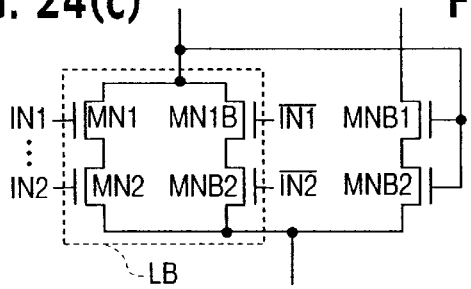

In FIGS. 24(a) to 24(g), another configuration of the logic circuit for input LB used in the twelfth embodiment of the present invention is shown. In the above twelfth embodiment, the logic circuit for input LB is composed of one transistor. However, a logic circuit for input LB shown in FIG. 24(a) is composed of plural transistors connected in parallel. In this case, the SCL circuit is a decoder circuit, the result of OR is included in output Q, and the result of NOR is included in output /Q. The logic circuit for input LB shown in FIG. 24(b) is composed of plural cascaded transistors. In this case, the result of AND is included in output Q and the result of NAND is included in output /Q. The logic circuit for input LB shown in FIG. 24(c) is composed of a set of two cascaded transistors which receive each input IN1 and IN2, and a set of two cascaded transistors which receives its complementary input. In this case, the result of XOR is included in the output /Q and the converse result is included in the output Q.

Figure 24D:
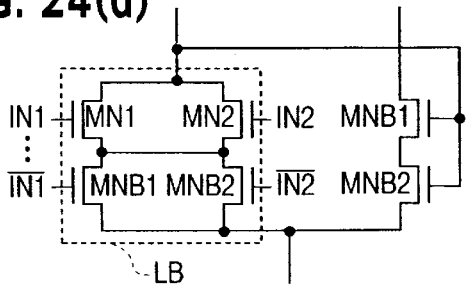
Figure 24E:
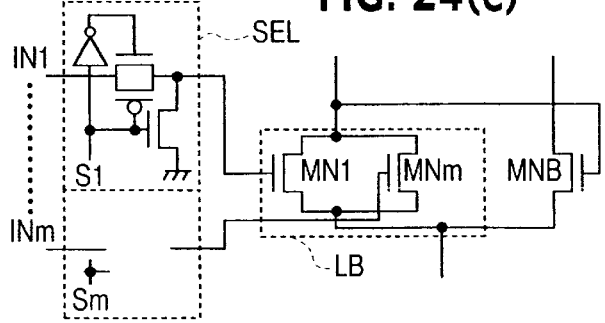
Figure 24F:
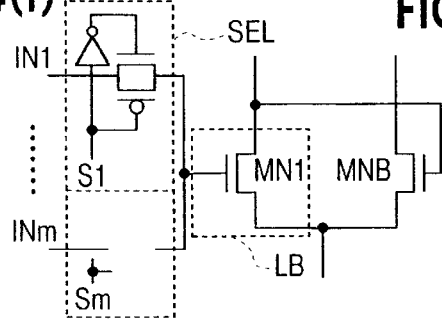
Figure 24G:
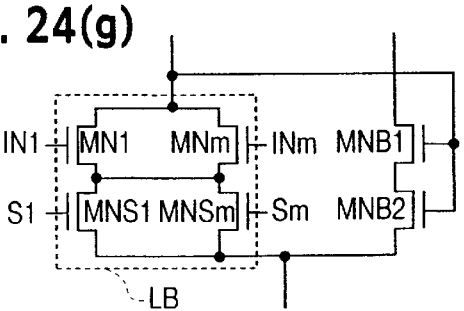

In FIG. 24(d), the configuration in which the same logical result as that in FIG. 24(c) is acquired, though connection is different is shown. In FIG. 24(e), the configuration showing the input to the logic circuit for input LB via a selection circuit SEL is shown. The decision of which signal is selected to be transmitted to the logic circuit for input LB is controlled by selection signals S1 to Sm. When the selection circuit SEL is unselected, the output is kept at a low electric potential. In FIG. 24(f), the configuration including the selection circuit SEL is also shown, however, the output of the selection circuit SEL is wired ORed. In this case, when the selection circuit SEL becomes unselected, any preceding information is kept in the output of the selection circuit. The configuration shown in FIG. 24(g) is the same as the configuration shown in FIG. 24(c), however, as a selection signal S1 to Sm is used for a part of an input signal, the function is the same as that shown in FIG. 24(e). In FIGS. 24(b), 24(c), 24(d) and 24(g), plural transistors for reference are cascaded (the on-state resistance of the logic circuit for input and the transistor for reference is equalized), however, the number of columns of the transistors for reference is not limited.

Figure 25A:
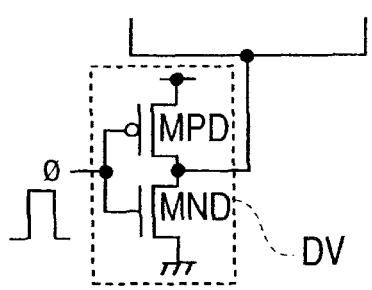
FIG. 25 shows another activation circuit used in the twelfth embodiment.
Figure 25B:
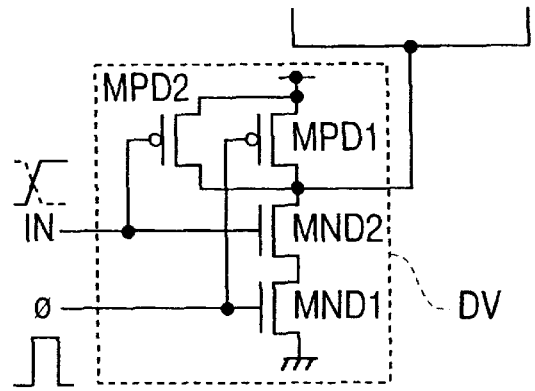

FIGS. 25(a) and 25(b) show another activation circuit used in the twelfth embodiment of the present invention. In FIG. 25(a), an activation circuit DV is composed by an inverter composed of transistors MPD and MND. A control signal φ is inputted to its input terminal and its output terminal is connected to a node of a source-coupled line of the SCL circuit. If the above transistor MPD is not provided, the node of the source-coupled line is precharged by only the transistor for precharge MPP2 via the transistor for reference MNB, shown in FIG. 22 (or is precharged by only the transistor for precharge MPP1 via the transistor for input MN1). However, if the transistor MPD is provided, the node is precharged by both transistors MPD and MPP2. Therefore, the precharge time at the node of the source-coupled line and at the drain node of MPP2 is reduced. In FIG. 25(b), the activation circuit DV is composed of a NAND circuit having plural inputs. In the above configuration, power consumption is reduced because even if a control signal φ is activated (i.e., changes to a electric potential), the SCL circuit is activated only when inputs to the NAND circuit are all at a high electric potential, and it is not activated at other times.

Figure 26A:
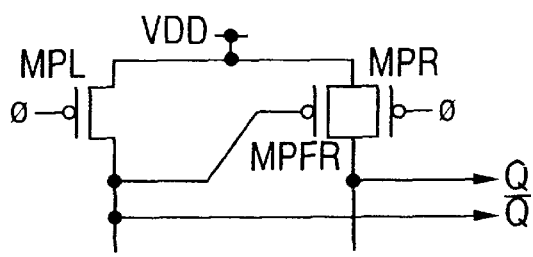
FIG. 26 are circuit diagrams showing another load used in the twelfth embodiment.
Figure 26B:
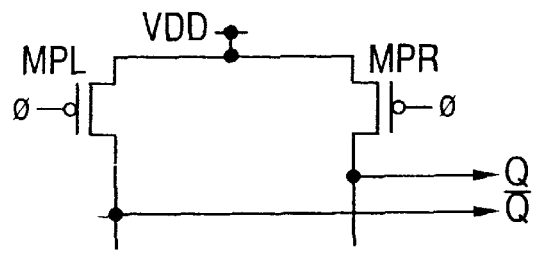
Figure 26C:
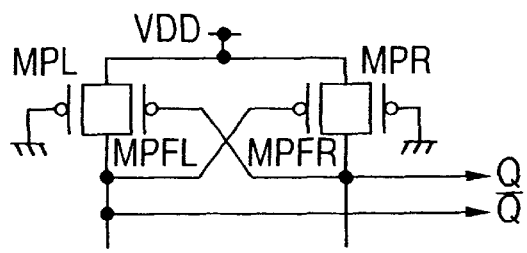

FIGS. 26(a) to 26(c) show another loader used in the twelfth embodiment of the present invention. FIG. 26(a) shows the configuration in which the transistor for level compensation MPFL, provided in the twelfth embodiment, is removed. In this case, when an input signal IN to the SCL circuit is at a low electric potential, the output node /Q is in a floating state during an evaluation phase, although the output node is not necessarily required. Therefore, there is an effect that reduces the area. In FIG. 26(b), the configuration in which both transistors for level compensation MPFL and MPFR are removed is shown. In this case, either of the output nodes Q or /Q becomes a floating state according to the electric potential of an input signal IN to the SCL circuit during an evaluation phase, although it is not necessarily required. However, for stable operation, the configuration described in the twelfth embodiment is, better than that shown in FIGS. 26(a) and 26(b). In FIG. 26(c), the gate of the transistors MPL and MPR for precharge is driven at a low electric potential VSS. In this case, the amplitude of the outputs Q and /Q is not full amplitude but can be set to arbitrary amplitude. The gate of the transistors MPL and MPR for precharge in each loader, shown in FIGS. 26(a) and 26(b), may be also driven at a low electric potential VSS.

Figure 27A:
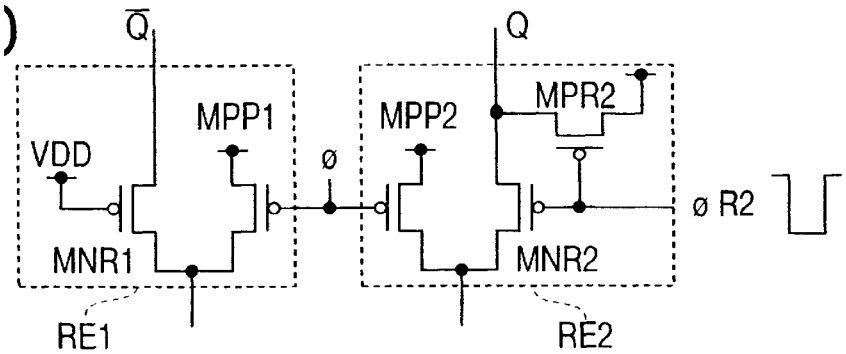
FIG. 27 show another reset circuit used in the twelfth embodiment.
Figure 27B:
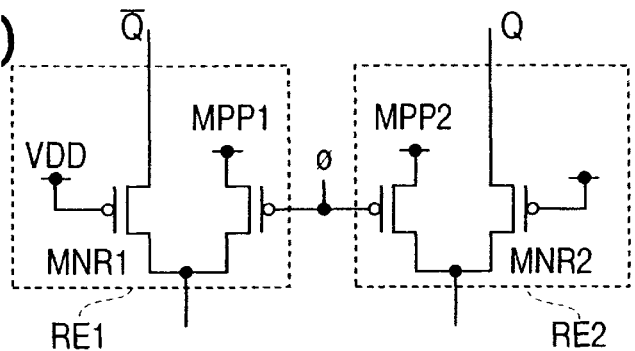
Figure 28:
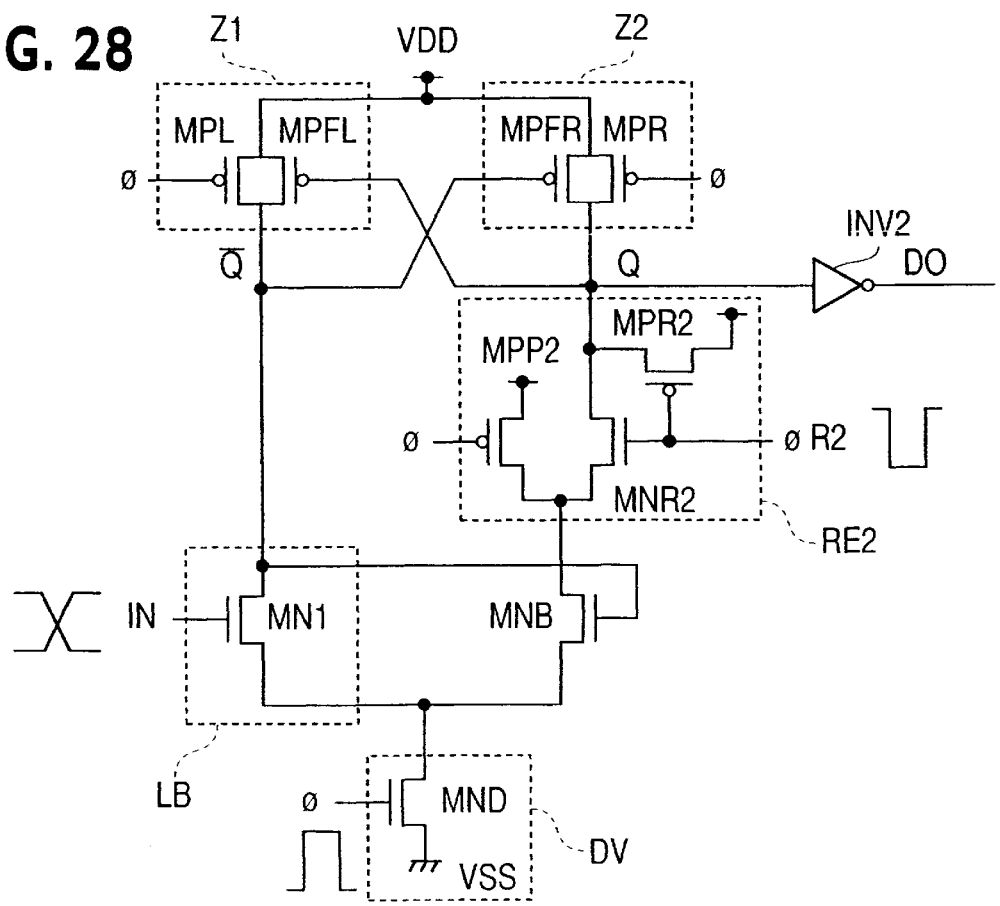
FIG. 28 is a circuit diagram showing a thirteenth embodiment.

FIGS. 27(a) and 27(b) show another reset circuit used in the twelfth embodiment of the present invention. In 27(a), the configuration that only one output, for example Q, is reset is shown. Therefore, the transistor for reset MPRL in the first reset circuit RE1 is removed. The gate of the transistor MNRL is connected to the high electric potential VDD and is always in a state of continuity. In FIG. 27(b), the configuration that a reset function is removed from both outputs is shown. This configuration is used in case only the effect of reducing noise by switching the above output node is utilized. In FIG. 22 and FIGS. 27, an example that a reset circuit is provided to both of complementary output (Q, /Q) is shown, however, as in the thirteenth embodiment shown in FIG. 28, a reset circuit may be also provided to either.

Figure 23:
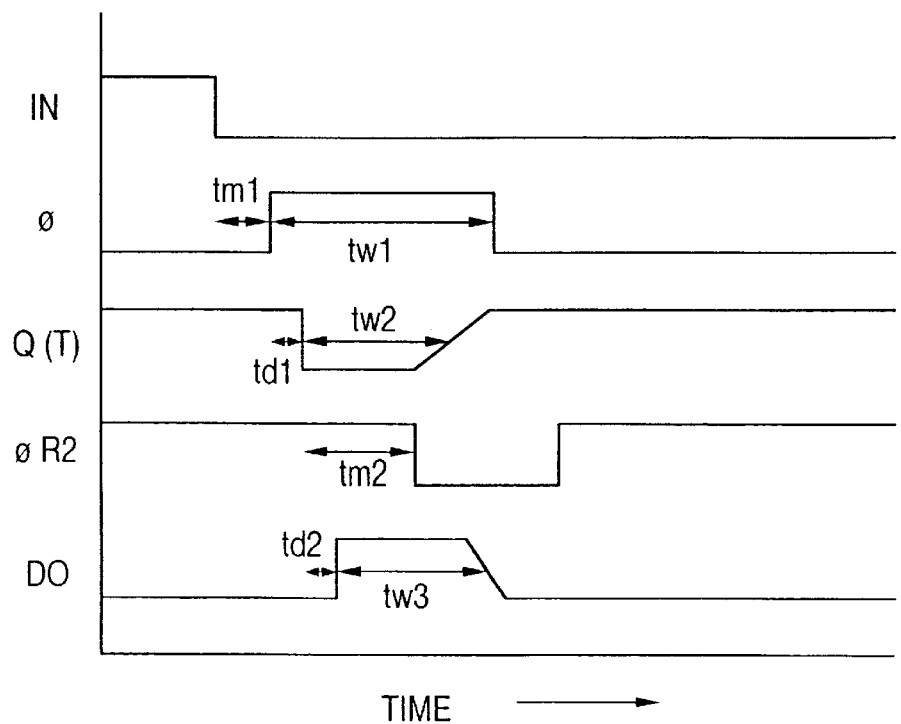
FIG. 23 is an explanatory drawing showing the operation in the twelfth embodiment.
Figure 29:
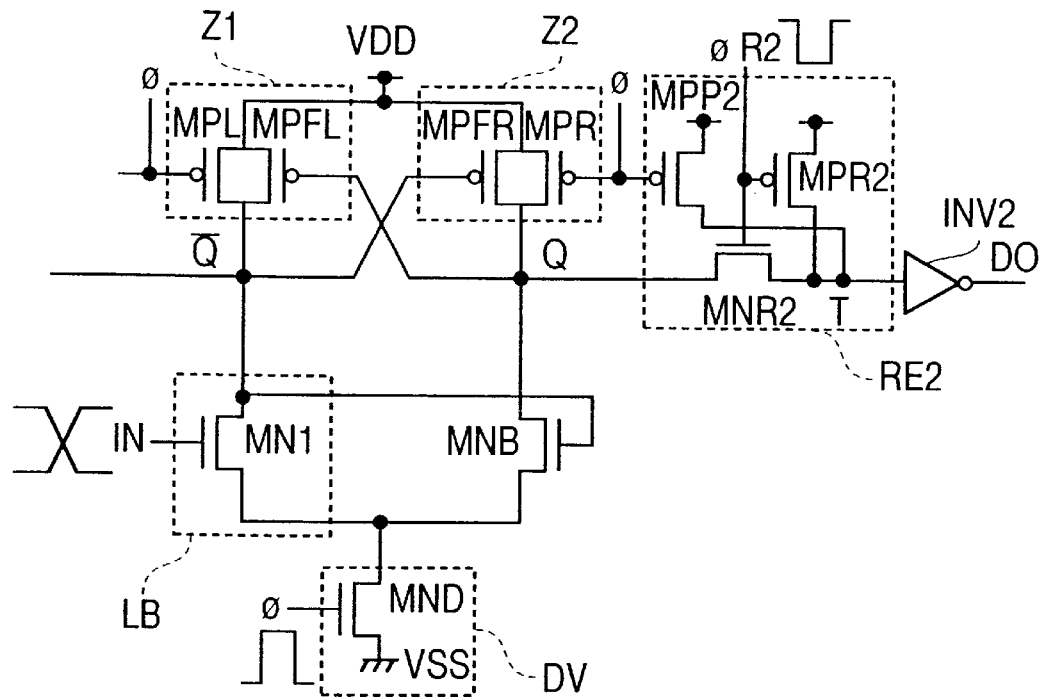
FIG. 29 is a circuit diagram showing a fourteenth embodiment.

FIG. 29 shows a fourteenth embodiment. In this embodiment, a reset circuit is added to the output terminal of the conventional type SCL circuit. An example of the configuration that a reset circuit is added to only the side of output Q for simplification will be described below. Reset operation in this embodiment is different in that the waveform of the output Q, described in relation to FIG. 23 is replaced with that of output T in this embodiment, although the others are the same. That is, as shown in FIG. 23, when a control signal φ (pulse length: tw1) is inputted while an input signal IN is at a low electric potential, transistors MND, MNB and MNR2 conduct and output T is switched from high electric potential to low electric potential. When a reset pulse φR2 is inputted, delayed by fixed time (tm2) after the output T is switched, the transistor MNR2 is turned off, and in the meantime, the transistor MPR2 conducts and the output T is charged so that it is at a high electric potential. As a result, the pulse length (tw2) of the output T in this embodiment is reduced, as compared with tw2 in the case of the eleventh embodiment, shown in FIG. 21. Therefore, as shown in FIG. 23, the pulse length (tw3) of the output DO of the next circuit (an inverter INV2) can be equalized to tw4 in the case of the eleventh embodiment, shown in FIG. 21.

Figure 30:
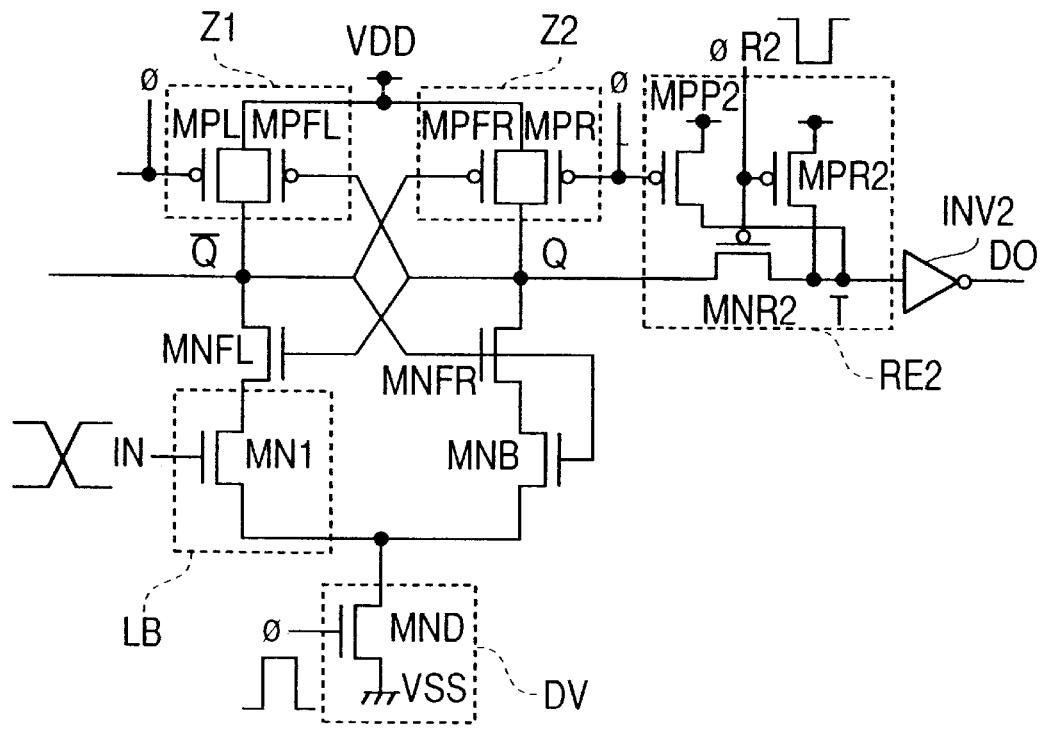
FIG. 30 is a circuit diagram showing a fifteenth embodiment.

FIG. 30 shows a fifteenth embodiment. In this embodiment, the SCL circuit in the above fourteenth embodiment is replaced with an SCL circuit provided with a latching function. A transistor MNFR for feedback is added between the output Q and a transistor for reference MNB. Also, another transistor for feedback MNFL is added between the output /Q and a logic circuit block LB. In the case of this configuration, even if the electric potential of input IN changes while a control signal φ is inputted and the SCL circuit is activated, the electric potential of the output (Q, /Q) is unchanged. The effect that the pulse length of the output and the pulse length of the output DO of the next circuit (the inverter INV2) are reduced is acquired by providing the above reset circuit to the output terminal of the SCL circuit provided with the latching function, as in the above twelfth to fourteenth embodiments in the above twelfth and thirteenth embodiments, the transistors for level compensation MPFL and MPFR are respectively provided to the nodes of the outputs (Q, /Q). However, in the above fourteenth and fifteenth embodiments, no transistor for level compensation is provided to the nodes of the outputs (T, /T), and for stable operation, the twelfth and thirteenth embodiments are better. A transistor for level compensation may be also provided to the nodes of the outputs (T, /T), however, the characteristic is not greatly enhanced, as compared with that in the twelfth and thirteenth embodiments.

Figure 31:
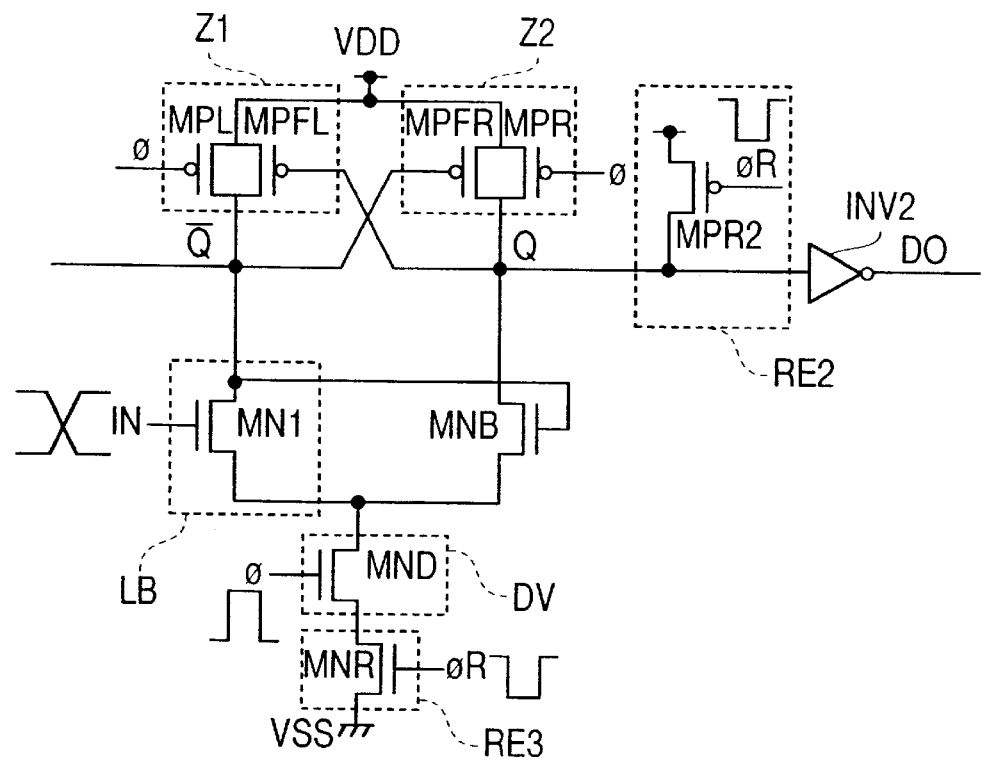
FIG. 31 is a circuit diagram showing a sixteenth embodiment.

Next, a configuration in which transistors for preventing a through state MNRL and MNR2, used in the above twelfth to fifteenth embodiments, are integrated will be described. FIG. 31 shows a sixteenth embodiment. In this embodiment, the respective transistors for preventing a through state MNRL and MNR2 in the reset circuits RE1 and RE2 in the fourteenth embodiment are integrated (the reset circuit RE1 is not shown), and are provided as a transistor for preventing a through state MNR.

Figure 32:
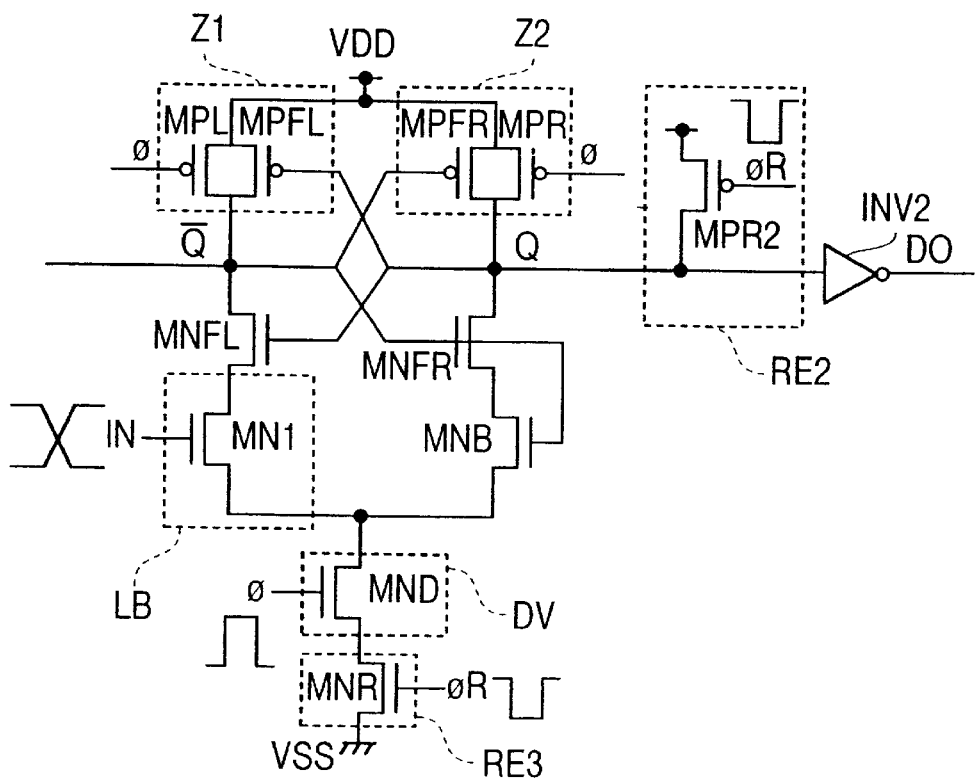
FIG. 32 is a circuit diagram showing a seventeenth embodiment.

Reset circuits RE1 and RE2 are respectively composed of only a transistor for reset MPRL and MPR2. That is, in this embodiment, transistors for precharge MPP1 and MPP2 are not provided, the transistors for preventing a through state MNRL and MNR2 are integrated as MNR, and the number of transistors is reduced. Reset operation in this embodiment is similar to the operation described in relation to FIG. 23. In a seventeenth embodiment, shown in FIG. 32, the configuration in case the above integration of the transistors for preventing a through state MNRL and MNR2 is performed in the fifteenth embodiment, shown in FIG. 30, is shown. Therefore, the operation is similar to that in the fifteenth embodiment.

Figure 33:
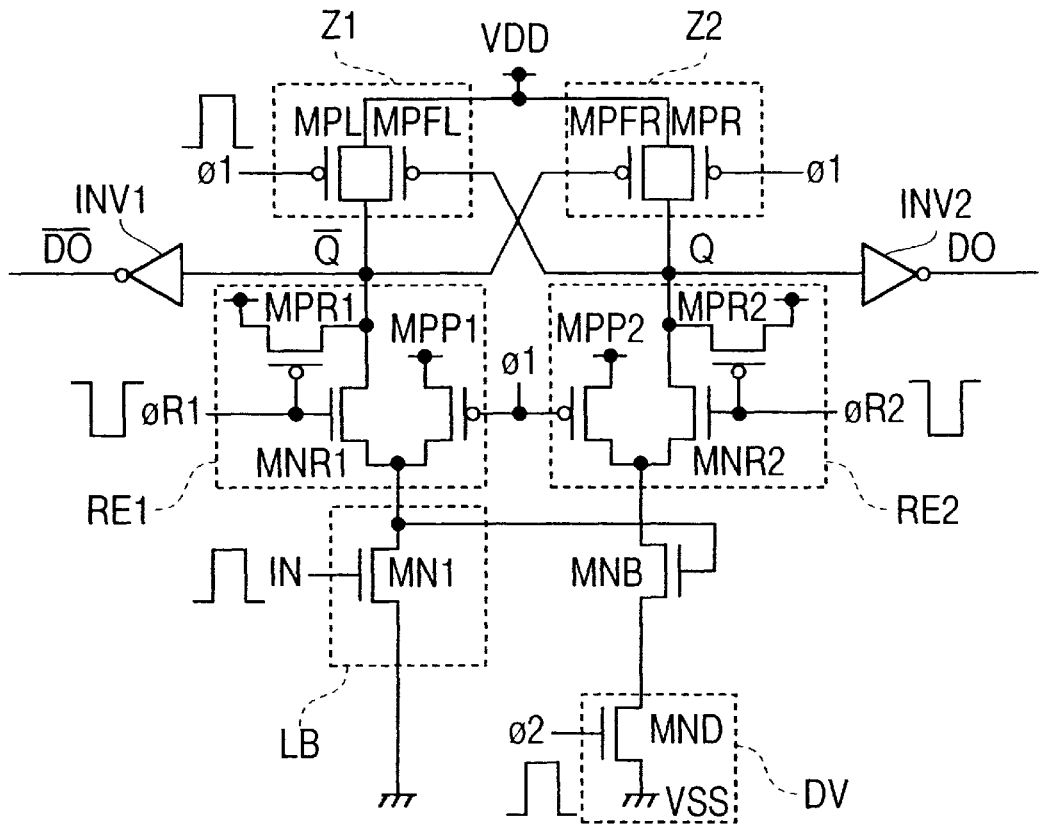
FIG. 33 is a circuit diagram showing an eighteenth embodiment.

FIG. 33 shows an eighteenth embodiment. This embodiment is different from the twelfth embodiment, shown in FIG. 22, in that the source of a transistor for input MNI in a logic circuit for input is not connected to the source of a transistor for reference MNB, but is connected to the low electric potential VSS. Also, this embodiment is different in that a transistor for precharge, used in loaders Z1 and Z2 and reset circuits RE1 and RE2, is driven by a first control signal φ1 and an activation circuit DV is driven by a second control signal φ2.

In this embodiment, as the source of the transistor for input MN1 is directly connected to low electric potential VSS, a response at the drain of the transistor for input MN1 is faster than that in the twelfth embodiment when input IN is switched from the low electric potential to high electric potential. Therefore, as a transistor for reference MNB is fast and does not conduct, the effect is that noise from switching on the side of the output Q is reduced. Also, as the response of the transistor for input MN1 is fast, the delay time of the outputs (Q, /Q) can be reduced more than that in the twelfth embodiment. A transformed example of the configuration in this embodiment can be applied to the above twelfth to seventeenth embodiments. However, first, two control signals φ1 and φ2 are required, second, the control signal 01 is required to be inputted at an earlier time than the control signal φ2 and the input IN (in a converse case, through current flows), and third, the electric potential of input IN in precharge is necessarily required to be low (in a converse case, through current flows). As the conditions in use are set as described above, the above twelfth to seventeenth embodiments are superior in usability. The SCL circuit described in the twelfth to eighteenth embodiments can be replaced with the SCL circuit 4 in the decoder circuit in the above first to eleventh embodiments.

Figure 34A:
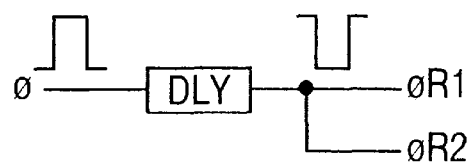
FIG. 34 show a reset signal generation method.
Figure 34B:
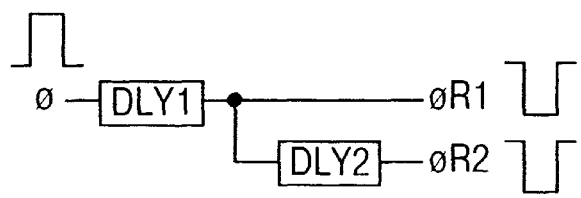

FIG. 34 shows a reset pulse generation method. In FIG. 34(a), a method of delaying a control signal φ via a delay circuit DLY and generating reset pulses φR1 and φR2 is shown. In this case, the same pulse length is acquired in complementary outputs (Q, /Q or T, /T). In FIG. 34(b), a method of delaying a control signal (A via a delay circuit DLY1 to generate a reset pulse φR1 and further delaying the reset pulse φR1 via a delay circuit DLY2 to generate a reset pulse φR2 is shown. This method is effective when the pulse length of the other output (for example, Q or T) is desired to be longer than the pulse length of one output (for example, /Q or /T).

It is to be understood, of course, that a transformed example in which the N-type devices in the above embodiments are replaced with P-type devices and P-type devices are replaced with N-type devices would readily be understood by those familiar with this art. The MOS transistor may also be another field effect transistor. Further, the number of columns of the inverters used in the buffer, the predecoder and the main decoder is not particularly limited only if the polarity of output is considered.

According to the present invention, the speedup, the reduction of the power consumption, and the increase of cycles of the decoder circuit are enabled, and in a semiconductor memory for example, the reduction of access time, the reduction of power consumption, and the increase of cycles are enabled.

What is claimed is:

1. A semiconductor integrated circuit, wherein:
   a buffer circuit from which a true and a complementary signal are output based upon input signals and a decoder circuit for decoding based upon signals output from said buffer circuit are provided;
   a semiconductor logic circuit in which at least one of said buffer circuit and said decoder circuit is controlled for precharge and evaluation operation according to the polarity of a control signal input to its control terminal and the true and the complementary signal are output based upon input signals input to its input terminals is provided; and said semiconductor logic circuit of said decoder circuit is composed of a set in which an output signal including said true of any of plural said buffer circuits is input to its control terminal and a set to which a complementary output signal is input, and output signals from the other buffer circuits are input to the input terminal of said semiconductor logic circuit of said decoder circuit.

2. A semiconductor integrated circuit according to claim 1, wherein:

said decoder circuit is provided with at least one predecoder circuit for decoding based upon signals output from said buffer circuits and a main decoder circuit for decoding based upon a signal output from said predecoder circuit; and said predecoder circuit and said main decoder circuit re respectively composed of at least either of the following configuration (1) or (2):

(1) configuration that at least any of plural said predecoder circuits is composed of said semiconductor logic circuit, said predecoder circuit is composed of a set in which an output signal including said true of any of plural said buffer circuits is input to the control terminal of said semiconductor logic circuit and a set to which a complementary output signal is input and signals output from the other buffer circuits are input to the input terminal of the semiconductor logic circuit of said predecoder circuit; and (2) configuration that said main decoder circuit is composed of said semiconductor logic circuit and a signal output from any of plural said predecoder circuit is input to the control terminal of said semiconductor logic circuit.

3. A semiconductor integrated circuit according to claim 1, comprising:

a circuit for reducing a signal output from said semiconductor logic circuit or the pulse length of the next circuit by a reset pulse generated based upon a control signal input to the control terminal of said semiconductor logic circuit.

4. A semiconductor integrated circuit according to claim 1, wherein:

an input signal having a low amplitude is input to the input terminal of at least any of said semiconductor logic circuits.

* * * * *

UNITED STATES PATENT AND TRADEMARK OFFICE
CERTIFICATE OF CORRECTION

PATENT NO. : 6,369,617 B1
DATED : April 9, 2002
INVENTOR(S) : Kazuo Kanetani et al.

It is certified that error appears in the above-identified patent and that said Letters Patent is hereby corrected as shown below:

<u>Title page,</u>
Item [75], delete "Fumihiko Arakawa, Tokorozawa".

Signed and Sealed this

Fourth Day of February, 2003

JAMES E. ROGAN
*Director of the United States Patent and Trademark Office*